United States Patent
Cui et al.

(10) Patent No.: US 12,395,163 B2
(45) Date of Patent: Aug. 19, 2025

(54) METHOD AND SYSTEM FOR INJECTION LOCKED DIVIDER WITH FREQUENCY CALIBRATION

(71) Applicant: Avago Technologies International Sales Pte. Limited, Singapore (SG)

(72) Inventors: Delong Cui, Irvine, CA (US); Guansheng Li, Irvine, CA (US); Jun Cao, Irvine, CA (US); Yonghyun Shim, Irvine, CA (US); Yu-Ming Ying, Irvine, CA (US)

(73) Assignee: Avago Technologies International Sales Pte. Limited, Shenzhen (CN)

( * ) Notice: Subject to any disclaimer, the term of this patent is extended or adjusted under 35 U.S.C. 154(b) by 0 days.

(21) Appl. No.: 18/499,186

(22) Filed: Oct. 31, 2023

(65) Prior Publication Data

US 2025/0141435 A1 May 1, 2025

(51) Int. Cl.
*H03K 5/00* (2006.01)
*H03K 19/20* (2006.01)

(52) U.S. Cl.
CPC ......... *H03K 5/00006* (2013.01); *H03K 19/20* (2013.01)

(58) Field of Classification Search
CPC . H03L 7/0995; H03L 7/24; H03L 7/07; H03L 7/0805; H03L 7/0816; H03L 7/0818; H03L 7/083; H03L 7/091; H03L 7/0998; H03L 7/20; H03L 7/23; H03L 7/0802; H03L 7/085; H03L 7/093; H03L 7/1806; H03K 3/0315; H03K 3/0322; H03K 3/354;
(Continued)

(56) References Cited

U.S. PATENT DOCUMENTS

| 7,564,284 B2* | 7/2009 | Henzler | G04F 10/06 |
| | | | 327/263 |
| 9,755,574 B2* | 9/2017 | Chatwin | H03B 1/04 |
| 10,014,868 B1* | 7/2018 | Raj | H03L 7/24 |

(Continued)

FOREIGN PATENT DOCUMENTS

WO    WO-2023/043613 A1    3/2023

OTHER PUBLICATIONS

Extended European Search Report on EP Appln. No.24206893.0 dated Mar. 31, 2025.

(Continued)

*Primary Examiner* — John W Poos
(74) *Attorney, Agent, or Firm* — Foley & Lardner LLP

(57) ABSTRACT

In some implementations, a circuitry may include a series of symmetrical stages with an initial stage in the series coupled to an input signal having a first plurality of phases and an output stage in the series coupling an output signal comprising a second plurality of phases to a calibration engine, where a quantity of the phases in the output signal is increased based at least on a quantity of the symmetrical stages and a quantity of the first plurality of the phases in the input signal. In addition, the circuitry may include implementations, where the calibration engine calibrates a frequency of the circuitry within a range based at least on a target frequency. The circuitry may include implementations, where the calibration engine outputs a current provided to the series, where the output current can be based at least on a calibrated frequency.

18 Claims, 13 Drawing Sheets

(58) Field of Classification Search
CPC ...... H03K 21/00; H03K 21/026; H03K 21/12; H03K 3/013; H03K 3/356017
See application file for complete search history.

(56) References Cited

U.S. PATENT DOCUMENTS

| | | | |
|---|---|---|---|
| 10,536,151 B1 * | 1/2020 | Zhou | G06F 1/06 |
| 10,566,958 B1 * | 2/2020 | Song | G06F 1/10 |

OTHER PUBLICATIONS

Gautam R et al. "A 2.5-5GHz Injection-Locked Clock Multiplier with Embedded Phase Interpolator in 65nm Cmos", IEEE, 2020, pp. 1-6.

Khoi T. Phan et al. "A 1.92GHZ-3.84GHz 0.74ps-1.09ps-Jitter Inductor-less Injection-Locked Frequency Synthesizer with Automatic Frequency Selection and Timing Alignment", IEEE Asian Solid State Circuits Conference, Nov. 7-10, 2021/ Session 12/ Paper 12.5, pp. 1-3.

Tejasvi Anand et al. "A 5 GB/s, 10 ns Power-On-Time, 36 uW Off-State Power, Fast Power-On Transmitter for Energy Proportional Links", IEEE Journal of Solid-State Circuits, vol. 19, No. 10, Oct. 2024, pp. 2243-2258.

Zhaoyang Weng et al. "A 400MHz/900MHz Dual-Band Ultra-Low-Power Digital Transmitter for Biomedical Applications", IEEE Radio Frequency Integrated Circuits Symposium, 2020, pp. 331-334.

\* cited by examiner

METHOD AND SYSTEM FOR INJECTION LOCKED DIVIDER WITH FREQUENCY CALIBRATION

FIELD OF DISCLOSURE

The present disclosure relates generally to the field of injection locked dividers and more specifically to injection locked dividers having frequency calibration.

BACKGROUND

Multiple-phase clocks produce several distinct clock signals with different phases. The multiple-phase clocks can provide improved data sampling, reduce clock-to-data skew, enable parallel operations, and reduce errors. Multiple phase clock generation using an injection locked ring oscillator (ILRO) can be used in serializers and deserializers for phase alignment, low jitter, power efficiency, scalability, tunability, and reduced number of components.

Having asymmetric injection, the ILRO generates intrinsic static skew between the injected and non-injected nodes. Intrinsic static skew in the ILRO refers to the phase differences between the multiple clock phases generated by the ILRO. A quadrature locked loop can be used to compensate the intrinsic static skew. Due to the intrinsic mismatch, the quadrature loop can shift a self-oscillation frequency of the ILRO further away from the desired operating frequency. This shift can degrade other performance characteristics related to the ILRO, such as a locking range and jitter filtering.

SUMMARY

A symmetrical injection locked divider can provide skew correction from super-harmonics. For example, an injection locked divider (IL-DIV or IL-divider) can function as a divider dividing the number of phases by a number N and reduce an in-phase and quadrature (I/Q) mismatch resulting from injection clocks. Due to the symmetric injection architecture, no quadrature locked loop (QLL) may be required and only frequency calibration can be added. To reduce the input skew and optimize jitter performance over a process, voltage, and temperature (PVT) factor at different clock frequencies, the IL-divider can be designed with a narrow locking range, and the frequency calibration engine can be utilized for such narrow locking range. Buffers can be used to provide a fixed swing and duty cycle control for the injection clocks. The buffers reduce the IL-divider locking range and bandwidth sensitivity.

In one general aspect, a circuitry may include a series of symmetrical stages with an initial stage in the series coupled to an input signal. In some embodiments, the input signal may have a first plurality of phases. In some embodiments, the series can have an output stage that couples an output signal including a second plurality of phases to a calibration engine. In some embodiments, a quantity of the phases in the output signal including the second plurality of phases is increased based at least on a quantity of the symmetrical stages and a quantity of the first plurality of the phases in the input signal. The calibration engine can calibrate a frequency of the circuitry within a range based at least on a target frequency. In some embodiments, the calibration engine outputs a current provided to the series. In some embodiments, the output current is based at least on a calibrated frequency. Other embodiments of this aspect include corresponding computer systems, apparatus, and computer programs recorded on one or more computer storage devices, each configured to perform the actions of the methods.

Implementations may include one or more of the following features. Each stage of the series of the symmetrical stages may include a pair of first inverters coupled in series to a pair of cross-coupled inverters or in parallel to a pair of feedforward resistors. In implementations, where each stage of the series of the symmetrical stages includes the pair of first inverters coupled in series to the pair of cross-coupled inverters, each stage of the series of symmetrical stages can further include a switch coupled in parallel to the cross-coupled inverters, where the switch can control a strength of injection of the output voltage. In some embodiments, the switch can reduce a capacity loading of a previous stage of the series of the symmetrical stages on a subsequent stage of the series of symmetrical stages. In some embodiments, each stage of the series of symmetrical stages can further include a capacitor coupled in parallel to the cross-coupled inverters, where the capacitor can tune a frequency of each stage of the series of symmetrical stages. In some embodiments, the capacitor reduces a jitter of each stage of the series of the symmetrical stages.

In some embodiments, the calibration engine further includes a frequency calibrator. In some embodiments, a current source is coupled to the frequency calibrator, where the frequency calibrator sends instructions to a circuitry of the current source. In some embodiments, the instructions are based at least on the calibrated frequency. In some embodiments, the current source transmits the current to the circuitry, where the current is based at least on a calibrated frequency. The circuitry may include a series of loops, each loop having a series of inverters coupled in parallel to an amplifier, where each loop can control a duty cycle of the phase of the first plurality of phases of the input signal. The circuitry may include a series of buffers coupled between the series of the loops and the series of the symmetrical stages, where the series of the buffers can provide a fixed swing of the output signal including the second plurality of phases. The circuitry may include a series of buffers coupled between the series of loops and the series of the symmetrical stages, where the series of the buffers can reduce at least one of a frequency range of the output signal or a sensitivity of a bandwidth of the frequency range of the output signal where the output signal includes the second plurality of phases. Implementations of the described techniques may include hardware, a method or process, or a computer-tangible medium.

In one general aspect, a system may include a series of symmetrical stages, where the series are configured to receive an input signal having a first plurality of phases. The system may also include a calibration engine coupled to an output stage of the series and configured to receive an output signal from the series. In some embodiments, the output signal can include a second plurality of phases. The calibration engine can be configured to calibrate a frequency of the series of symmetrical stages to operate at a target frequency. The system may furthermore include implementations where the output stage of the series of symmetrical stages is configured to provide the output signal. In some embodiments, the output signal can represent an increase to a quantity of the first plurality of phases of the input signal based at least on a quantity of the symmetrical stages. In some embodiments, the calibration engine can be configured to provide a current to the series of symmetrical stages based at least on the frequency calibrated by the calibration engine. Other embodiments of this aspect include corresponding computer systems, apparatus, and computer programs recorded on one or more computer storage devices, each configured to perform the actions of the methods.

Implementations may include one or more of the following features. The system having implementations where each of the symmetrical stages includes a pair of first inverters coupled in series to a pair of cross-coupled inverters or in parallel to a pair of feedforward resistors. In implementations, where each stage of the series of the symmetrical stages includes the pair of first inverters coupled in series to the pair of cross-coupled inverters, each stage of the series of the symmetrical stages can further include a switch coupled in parallel to the cross-coupled inverters, where the switch can control a strength of injection of the output voltage. In some embodiments, the switch reduces a capacity loading of a previous stage of the series of the symmetrical stages on a subsequent stage of the symmetrical stages. In some embodiments, each stage of the series of symmetrical stages further includes a capacitor coupled in parallel to the cross-coupled inverters, where the capacitor can tune a frequency of each stage of the series of the symmetrical stages. In some embodiments, the capacitor reduces a jitter of each stage of the series of symmetrical stages. In some embodiments, the calibration engine further includes a frequency calibrator, a current source coupled to the frequency calibrator, where the frequency calibrator sends instructions to a circuitry of the current source. In some embodiments, the instructions can be based at least on the calibrated frequency. In some embodiments, the current source transmits the current to the circuitry, where the current can be based at least on the calibrated frequency. The system can include implementations where the circuitry further includes a series of loops, where each loop can have a series of inverters coupled in parallel to an amplifier. In some embodiments, each loop can control a duty cycle of the phase of the first plurality of phases of the input signal. Implementations of the described techniques may include hardware, a method or process, or a computer-tangible medium.

In one general aspect, a method may include increasing a quantity of phases in an output signal where the output signal includes a first plurality of phases. Increasing the quantity of the phases in an output signal can be based at least on (i) a quantity of symmetrical stages in a series of the symmetrical stages and (ii) a quantity of a second plurality of phases in an input signal. In some embodiments, the series of the symmetrical stages can have an initial stage in the series, where the initial stage is coupled to the input signal having the second plurality of the phases. In some embodiments, the series of the symmetrical stages can have an output stage in the series, where the output stage couples the output signal to a calibration engine. The method may also include calibrating, by the calibration engine, a frequency of a circuitry within a range based at least on a target frequency. The method may furthermore include outputting, by the calibration engine, a current coupled to the series, where the output current can be based at least on a calibrated frequency. Other embodiments of this aspect include corresponding computer systems, apparatus, and computer programs recorded on one or more computer storage devices, each configured to perform the actions of the methods.

Implementations may include one or more of the following features. The method may include sending, by a frequency calibrator of the calibration engine, instructions to a circuitry of a current source. In some embodiments, the instructions can be based at least on the calibrated frequency. The method may include transmitting, by the current source to the frequency calibrator, the current to the circuitry, where the current can be based at least on the calibrated frequency. Implementations of the described techniques may include hardware, a method or process, or a computer-tangible medium.

DETAILED DESCRIPTION

Figure 1:
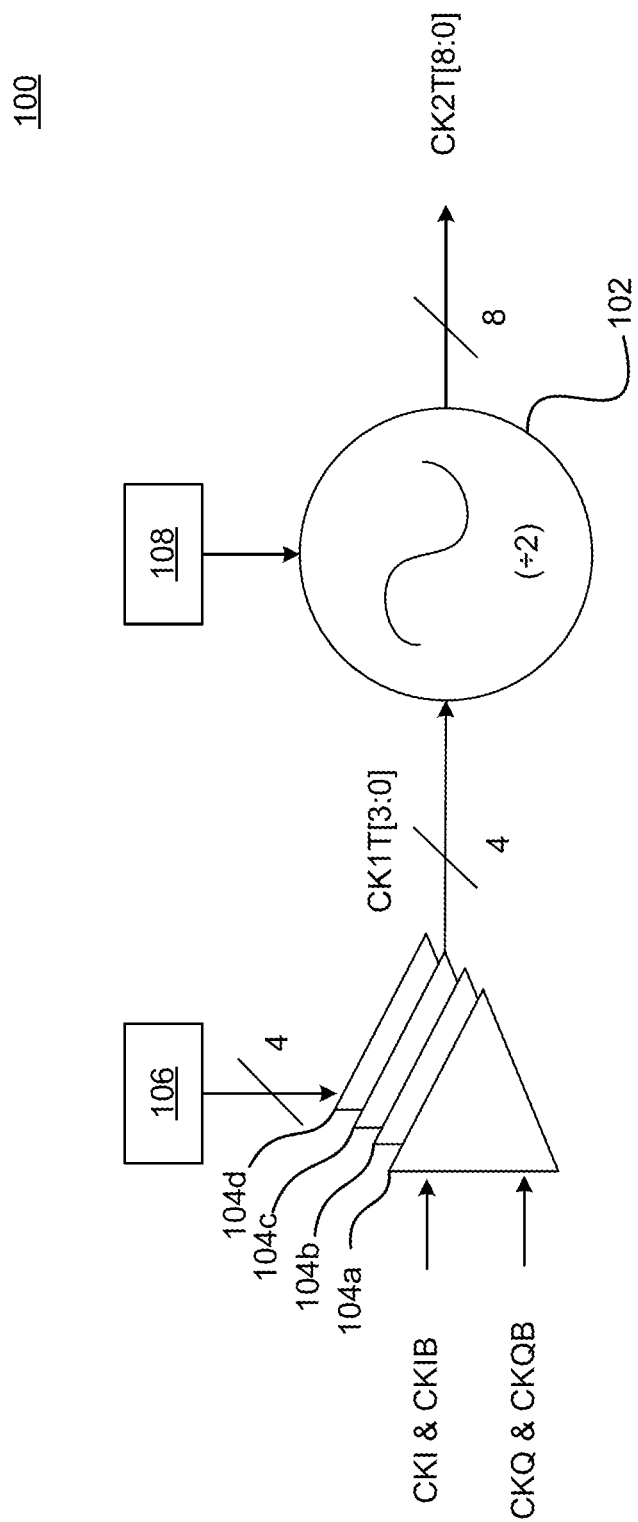
FIG. 1 illustrates an injection locked divider (IL-DIV or IL-divider) system 100 having an IL-divider 102 in a receiving clock path, according to some embodiments.

Injection refers to the process of introducing an external signal, referred to as the "injection signal," into the circuitry of an injection locked divider. An injection locked divider is a frequency divider circuit that is designed to synchronize with an external signal and produce a frequency output that can be, for example, a fraction of the input frequency. When the injection signal is introduced, the injection signal causes the circuit to lock onto the frequency of the external signal, resulting in a relatively stable frequency output.

The injection process can at least partially rely on a phase detector, which compares the phase of the injection signal to the output signal and generates a control signal that adjusts the frequency of the divider circuit. By adjusting the frequency, the circuit can lock onto the frequency of the injection signal and produce a relatively stable output signal.

Injection clock swing can affect the ILRO frequency locking range and bandwidth. Bandwidth refers to the amount of data that can be transmitted over a network or communication channel in a given amount of time. The bandwidth can be measured in bits per second or bytes per second, for instance. A wider locking range requires a larger injection swing. The injection stage can be designed to tune the properties of the ILRO such as the self-oscillation frequency, bandwidth, and locking range.

The self-oscillation frequency (SOF) of the ILRO can vary when a process, voltage, and temperature (PVT) factor varies, and the frequency locking range needs to be taken into consideration in the ILROs. A wider locking range offers robustness across broader PVT at the expense of the input clock jitter requirement and phase correction capability. Calibration of the SOF of the ILRO to the clock operating frequency can at least partially mitigate the constraints associated with the locking range.

Various methods can be used to tune the frequency range. For example, a supply voltage VDD can be provided to the asymmetric ILRO which can receive a two bit input signal CKi[1:0] and output a four bit output signal CKo[3:0]. The two bit input signal CKi[1:0] represents bit signals CKi[1] and CKi[0]. The four bit output signal CKo[3:0] represents bit signals CKo[3], CKo[2], CKo[1], and CKo[0].

The asymmetric ILRO can include a series of stages (e.g., two stages) where each stage includes a pair of main inverters having a pair of parallel cross-coupled inverters coupled in series between the main inverters. A capacitor can be coupled in series between the main inverters and in parallel with the pair of the cross-coupled inverters.

A cross-coupled inverter can be a digital logic circuit used in implementation of memory elements in digital circuits. A pair of the cross-coupled inverters can be connected in a feedback loop, where the output of one inverter is coupled to the input of the other inverter and vice versa. The feedback loop creates a bistable state, where the circuit can remain in one of two relatively stable states for a long period of time, until a signal is applied to change the signal state.

A first input bit signal CKi[0] can be supplied to an initial stage between a first main inverter of the initial stage and the pair of the cross-coupled inverters of the initial stage. A second input bit signal CKi[1] can be supplied to the initial stage between a second main inverter of the initial stage and the pair of the cross-coupled inverters of the initial stage. A first output bit signal CKo[0] can be output at the initial stage between the first main inverter of the initial stage and the pair of the cross-coupled inverters of the initial stage. A second output bit signal CKo[1] can be output at a second stage between a second main inverter of the second stage and a pair of cross-coupled inverters of the second stage. A third output bit signal CKo[2] can be output at the initial stage between the second main inverter of the initial stage and the pair of the cross-coupled inverters of the initial stage. A fourth output bit signal CKo[3] can be output at the second stage between a first main inverter of the second stage and the pair of the cross-coupled inverters of the second stage.

To tune the frequency range, the following methods can be used. The capacitor at the initial stage or the second stage can be adjusted to cover a wide frequency range. Such adjustment contributes to additional loading for high frequency clock operation.

Another tuning method can be performed via controlling at least one of the cross-coupled inverters of the initial stage or the second stage to achieve a wide frequency range. Such tuning method may cause a diminished start-up condition of the oscillator and can contribute to additional loading at a critical node.

Also, adjustment of a size for the main inverter of the initial stage or the second stage can be performed to support different frequency applications. Such adjustment can be achieved via adding P-channel metal-oxide-semiconductor (PMOS) or N-channel metal-oxide-semiconductor (NMOS) current source to each main inverter. Such adjustment of the main inverter size may cause an additional noise from the current source that may degrade an output jitter performance.

Jitter refers to the variation in the timing of a signal transition. Jitter can disrupt the accuracy and reliability of data transmission. Jitter can cause errors in digital systems and can lead to data loss, interference, or corruption. Jitter can occur due to various factors, such as electromagnetic interference, signal reflections, crosstalk, and thermal noise. One type of jitter is deterministic jitter that can be caused by systematic factors, such as signal distortion, clock jitter, or interference.

The adjustment of the main inverter size may cause intrinsic mismatch in each stage due to a presence of individual current source mismatch. The adjustment of the main inverter size may cause an output common mode voltage to be more sensitive to PMOS or NMOS skew corner, and the next stage duty cycle can be distorted.

A duty cycle refers to the ratio of time a device or system remains active compared to the total time the device or system is available for operation. The duty cycle can be represented as a percentage. The duty cycle can refer to the amount of time a signal or current is ON compared to the total time the signal or current is available to be ON or OFF. The duty cycle can be the ratio of the signal active time to the total period of the signal.

Sensitivity refers to the ability of an electronic circuit to detect relatively small changes in input signals or parameters. Sensitivity is the degree to which a circuit can respond to weak or low-amplitude signals. Sensitivity can be measured in terms of volts per unit of input signal or ratio of output signal to input signal. A high sensitivity circuit can detect very small signals and produce a correspondingly larger output signal.

Injection strength is used by the ILRO to determine the locking range or bandwidth. Various methods can be used to control a programmable injection strength. For example, the injection strength can be controlled utilizing the injection buffer driving ability. Such control can be implemented in current mode logic devices via a differential pair of the buffers having current source tuning.

Generally, strength describes the intensity or magnitude of a particular characteristic, property, or force. In the context of electrical current, strength refers to the amount of electrical charge flowing through a conductor per unit time. The strength of electrical current is measured in amperes (amps). The strength of electrical voltage is measured in volts.

A buffer is a device or circuit that is used to separate or isolate two or more connected circuits with different characteristics. The buffer amplifies the input signal and maintains a relative integrity of the input signal while preventing or substantially reducing loss of signal due to impedance mismatch between the two circuits. The buffer can act as a bridge between two circuits, facilitating accurate and efficient transmission of the signal. For example, the buffer can be used to prevent signal distortion and to reduce the load on other components of the circuitry.

In the ILRO, a first buffer can be coupled between the first input bit signal CKi[0] and a first node which can be between a first main inverter of the initial stage and the pair of the cross-coupled inverters of the initial stage. A second buffer can be coupled between the second input bit signal CKi[0] and a second node which can be between a second main inverter of the initial stage and the pair of the cross-coupled inverters of the initial stage. Such configuration provides a wider swing variation across the PVT.

Another control method utilizing the injection buffer driving ability can be implemented in complementary metal-oxide-semiconductor (CMOS) logic devices. Such control method can be implemented via an inverter which has resistor degradation or PMOS and NMOS current source tuning. Such configuration increases the device size and can be parasitic at the injection node.

Another method to control the swing of the input signal CKi[1:0] can be implemented with an amplitude control loop. A loop refers to a closed path that electric current follows. The loop can be formed when a circuit connects two or more components or elements in a circuit that allow the flow of current between them. The direction and magnitude of the current in the loop are determined by the voltage and resistance of the components in the loop. The control method having the amplitude control loop uses analog rectifiers and can have low sensitivity to accurately convert input signals into a direct current (DC) output. Such configuration can be sensitive to the PVT and increase the loading of the input signal CKi[1:0].

FIG. 1 illustrates an injection-locked divider (IL-DIV or IL-divider) system 100 having an IL-divider 102 in a receiving clock path, according to some embodiments. The injection locked divider 102 can include a plurality of buffers 104a-104d corresponding to the number of input phases of the input signal CKi. For example, the input signal CKi can have four input phases: clock in-phase (CKI), clock inverted phase (CKIB), quadrature clock in-phase (CKQ), and quadrature clock inverted phase (CKQB).

In some embodiments, the IL-divider 102 can be symmetrical, e.g., the IL-divider 102 can have identical or similar stages coupled in series. A "stage" can refer to a specific component or section within the IL-divider 102. Each "stage" in the IL-divider 102 represents a discrete part or a building block of the overall IL-divider 102. These stages operate together to achieve frequency synchronization, clock generation, frequency synthesis, etc. Symmetrical stages are stages within various systems or circuits that are configured to maintain balance and relatively equal characteristics, such as amplitudes, delays, loading, impedance, and the like characteristics to enable that the system operates predictably and with reduced distortion or errors. Each stage in the symmetrical stages can have identical or similar components as other stages.

The symmetrical IL-divider 102 can provide skew correction from super-harmonic distortion utilizing a symmetrical injection. The IL-divider 102 can function as a divider of input phases by a number N (e.g., dividing the number of input phases by two). The IL-divider 102 can reduce a mismatch between in-phase and quadrature (I/Q) from four injection clocks.

An improved I/Q skew reduction can be achieved without quadrature locked loop (QLL) to compensate the I/Q skew. In some embodiments, due to the symmetric injection architecture of the IL-divider 102, the IL-divider system 100 can operate without a quadrature locked loop (QLL). The QLL generates in-phase (I) and quadrature (Q) signals. The I and Q signals generated by the QLL can be injected into the Injection-Locked Divider (ILRO) as reference signals. The ILRO can divide the frequency of these reference signals, maintaining a relatively precise phase and frequency synchronization due to injection locking.

In some embodiments, the IL-divider system 100 can include a frequency calibration engine 108. A calibration engine is a hardware, firmware, or software program or a combination thereof that can be used to adjust and fine-tune the settings of devices, systems, etc. The calibration engine can be configured to enable production of the accurate and reliable values output by the devices and systems. In some embodiments, the calibration engine can utilize a set of algorithms and mathematical models to evaluate the values output by the devices. The calibration engine compares the actual values produced by these devices against a provided reference value and adjusts the settings accordingly.

Calibration of frequency refers to a process of adjusting the output of a frequency IL-divider system 100 to match a known desired frequency. Such desired frequency can be provided by an external source. The purpose of calibration is to ensure that the output frequency of the IL-divider system 100 is accurate and reliable within a specified range. The calibration of frequency can be achieved through various methods, such as comparing the output frequency of the IL-divider system 100 with the desired frequency using a frequency counter or a spectrum analyzer. The calibration process involves adjusting the frequency of the IL-divider system 100 using a feedback loop until the output frequency matches the desired frequency.

In some embodiments, the IL-divider 102 can be designed to operate in a narrow locking range, and a frequency calibration engine 108 can enable reduction of an input skew and optimization of jitter performance over PVT at different clock frequencies. The duty cycle control engine 106 can include a plurality of duty cycle control loops 201 (FIG. 7) corresponding to the number of input phases of the input signal CKi.

The buffers 104a-104d and a duty cycle control engine 106 can provide a fixed swing and the duty cycle for the injection clocks. A fixed swing refers to a type of signal amplification that is used to produce an output signal with a relatively constant peak amplitude. The fixed swing can be achieved by setting the amplifier gain and bias such that the output signal is limited to a fixed voltage range, regardless of the amplitude of the input signal. A circuit for fixed swing amplification limits the amplitude of the output signal by, clipping off portions of the signal that exceed a pre-set threshold. The threshold can be adjusted manually or automatically to ensure that the output signal remains within the desired range.

The buffers 104a-104d, or the duty cycle control engine 106, can reduce the IL-divider locking range and bandwidth sensitivity. To minimize the IL-divider 102 jitter induced by power supply noise, the current source 186 (FIG. 3) can be added to the IL-divider system 100. Such current source 186 can isolate or reduce the noise from the power supply source.

The above-described architecture can be implemented with a different number of input and output phases, depending on the requirements of the IL-divider system 100. For example, the IL-divider 102 can divide input phases by four, eight, sixteen, etc.

Figure 2:
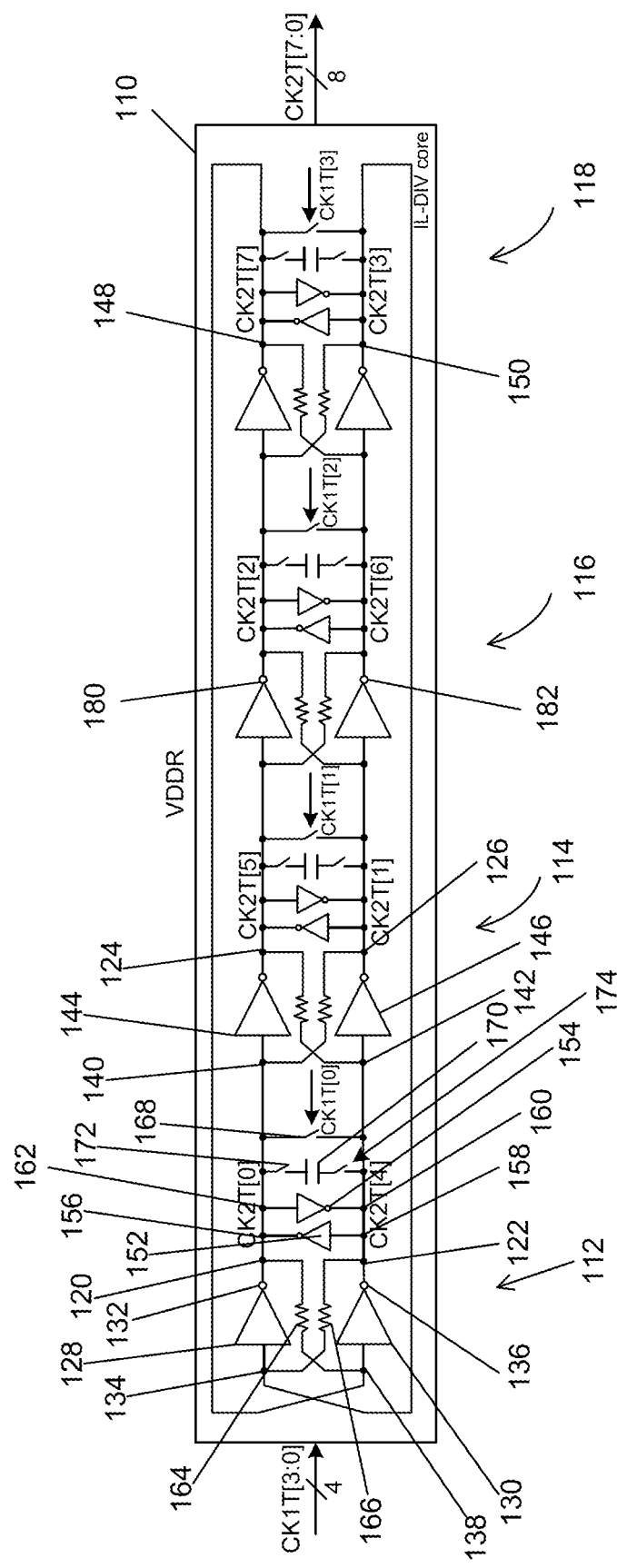
FIG. 2 illustrates a block diagram of a core component of an IL-divider core, according to some embodiments.

FIG. 2 illustrates a block diagram of a core component 110 of the IL-divider 102 (IL-divider core), according to some embodiments. In some embodiments, the IL-divider core 110 can include four stages: 112, 114, 116, and 118. The IL-divider core 110 can include main inverters (e.g., inverters 128, 130, 144, and 146) and cross-coupled inverters (e.g., inverters 152 and 154). In some embodiments, the IL-divider core 110 can include feedforward resistors (e.g., resistors 164 and 166) and injection switches (e.g., a switch 168 of the first stage 112). In some embodiments, the IL-divider core 110 can include a differential capacitor (e.g., a capacitor 170 of the first stage 112).

The IL-divider core 110 can receive a four-phase input signal CK1T[3:0], injected symmetrically into the IL-divider core 110. For example, the four-phase input signal CK1T[3:0] can include CK1T[0], CK1T[1], CK1T[2], and CK1T[3] phase input signals having first, second, third, and fourth phases, respectively. The IL-divider core 110 can generate an eight-phase CK2T[7:0] output signal, which can include CK2T[0], CK2T[1], . . . , CK2T[7] phase input signals having first, second, . . . , eighth phases, respectively.

Each stage can include a first node and a second node, such that the input signal is input between the first node and the second node. For example, the first stage (initial stage) 112 can include a first node 120 and a second node 122. The first stage 112 can receive the first input signal CK1T[0], which has the first phase of the input signal CK1T[3:0]. In some embodiments, the first input signal CK1T[0] is received between the first node 120 of the first stage 112 and the second node 122 of the first stage 112.

In some embodiments, the second stage 114 can include a first node 124 and a second node 126. The second stage 114 can receive the second input signal CK1T[1] having a second phase of the input signal CK1T[3:0]. In some embodiments, the second input signal CK1T[1] can be received between the first node 124 of the second stage 114, and the second node 126 of the second stage 114. In some embodiments, the third input signal CK1T[2] can be received between the first node 180 of the third stage 116 and the second node 182 of the third stage 116. In some embodiments, the fourth input signal CK1T[3] can be received between the first node 148 of the fourth stage 118 and the second node 150 of the third stage 118.

In some embodiments, the first output signal CK2T[0] can be output at the first node 120 of the first stage 112. In some embodiments, the second output signal CK2T[1] can be output at the second node 126 of the second stage 114. In some embodiments, the third output signal CK2T[2] can be output at the first node 180 of the third stage 116. In some embodiments, the fourth output signal CK2T[3] can be output at the second node 150 of the fourth stage 112. In some embodiments, the fifth output signal CK2T[4] can be output at the second node 122 of the first stage 112. In some embodiments, the sixth output signal CK2T[5] can be output at the first node 124 of the second stage 114. In some embodiments, the seventh output signal CK2T[6] can be output at the second node 182 of the third stage 116. In some embodiments, the eighth output signal CK2T[7] can be output at the first node 148 of the fourth stage 118.

Each stage 112-118 can include a first inverter and a second inverter (main inverters) each having a first end and a second end. For example, the first stage 112 can include a first inverter 128 having the first end 132 and a second end 134. In some embodiments, the first stage 112 can include a second inverter 130 having the first end 136 and a second end 138.

In some embodiments, the final stage (e.g., fourth stage) 118 can include the first node 148 and a second node 150. In some embodiments, the second end 134 of the first inverter 128 of the first stage 112 is coupled to the second node 150 of the final stage 114. In some embodiments, the first node 148 of the final stage 118 is coupled to the second end 138 of the second inverter 130 of the first stage 112.

In some embodiments, the second stage 114 can include a first inverter 144 having the first end and a second end 140. In some embodiments, the second stage 114 can include a second inverter 146 having the first end and a second end 142. In some embodiments, the first end 132 of the first inverter 128 of the first stage 112 is coupled to a first node 120 of the first stage 112. In some embodiments, the first node 120 of the first stage 112 is coupled to the second end 140 of the first inverter 144 of the second stage 114.

In some embodiments, each stage 112, 114, 116, and 118 of the IL-divider core 110 can include a pair of cross-coupled inverters. For example, the first stage 112 can include a pair of cross-coupled inverters, e.g., a third inverter 152 having a first end 156 and a second end 158 and a fourth inverter 154 including a first end 160 and a second end 162.

In some embodiments, the third inverter 152 of the first stage 112 and the fourth inverter 154 of the first stage 112 are cross-coupled such that the first end 152 of the third inverter of the first stage 112 and the second end 162 of the fourth inverter 154 of the first stage 112 are coupled to the first node 120 of the first stage 112.

In some embodiments, the third inverter 152 of the first stage 112 and the fourth inverter 154 of the first stage 112 are cross-coupled such that the second end 158 of the third inverter 152 of the first stage 112 and the first end 160 of the fourth inverter 154 of the first stage 112 are coupled to the second node 122 of the first stage 112.

In some embodiments, the IL-divider core 110 includes a first resistor 164 and a second resistor 166. In some embodiments, the first resistor 164 is coupled between the second end 138 of the second inverter 130 and the first node 120 of the first stage 112. In some embodiments, the second resistor 166 is coupled between the second end 134 of the first inverter 128 and the second node 122 of the first stage 112.

In some embodiments, the capacitor 170 of the first stage 112 can be coupled between the first node 120 and the second node 122 of the first stage 112. In some embodiments, the first stage 112 can have switches 172 and 174 between the capacitor 170 and the first node 120 and the second node 122, respectively, of the first stage 112.

In some embodiments, a size of the main inverters (e.g., inverters 128, 130, 144, 146) can be determined by the target frequency and jitter requirement. The cross-coupled inverters (e.g., inverters 152 and 154) can be used to reduce or avoid a latch-up state and satisfy a differential clock relationship at a PMOS/NMOS (PN) skew corner. The latch-up is a condition in which a device becomes locked in an undesirable state, leading to a malfunction or damage. By using complementary clock signals from the inverters 152 and 154, the setup and hold times for sequential elements in the circuit can be balanced resulting in data inputs being relatively stable during both rising and falling edges of the clock.

Feedforward resistors (e.g., resistors 164 and 166), also known as series input resistors, are passive electronic components that are used to improve the linearity and stability of an amplifier circuit. The feedforward resistors can attenuate the input signal and reduce the amount of distortion caused by non-linearities in the amplifier gain. By reducing the input signal level, feedforward resistors enable prevention of the amplifier from becoming saturated or clipping, which can cause distortion and signal loss.

The feedforward resistors (e.g., resistors 164 and 166) can be used to reduce or avoid the latch-up state, increase an operating frequency, and average out an I/Q phase mismatch. For example, in an amplifier, the input signal passes through the primary amplification path, which is designed to provide most of the amplification. This path may have limitations in terms of bandwidth due to the characteristics of active components in the path such as transistors or operational amplifiers. Feedforward resistors introduce a secondary path for the input signal. The secondary path diverts a fraction of the input signal and processes this fraction of the input signal separately. The diverted signal is processed in such a way that the diverted signal carries the distortion and nonlinearities present in the primary path. By processing the diverted signal to be out of phase and equal in magnitude to the distortion introduced in the primary path, the diverted signal is effectively cancelled out when combined with the main signal at the output. This cancellation process allows for a reduction in distortion and nonlinearities, effectively extending the usable bandwidth of the amplifier or circuit. The secondary path "cleans up" the signal, enabling the system to accurately amplify a wider range of frequencies.

It is desired to have in-phase (I) and quadrature (Q) components with equal amplitude and a 90-degree phase difference (quadrature). The I/Q mismatch can occur when there are discrepancies between the amplitude and phase of the I and Q components. The I/Q mismatch can occur due to imperfections in the components of, e.g., the modulator or demodulator, such as amplitude and phase imbalances in mixers, amplifiers, or couplers. In some embodiments, feedforward differential-mode compensation that uses feedforward resistors can reduce I/Q mismatch. For example, using feedforward resistors instead of active current sources can reduce input capacitance that, in turn, reduces the I/Q mismatch.

The injection switches (e.g., the switch 168) can include NMOS switches to reduce the loading of a previous stage and use the loading of each stage to determine the injection strength. The term "loading" refers to the process of transferring data, settings, or configurations from one stage to another. For example, switches 168 enable reduction of the effective loading time as data transfer and processing occur concurrently with the switch to the other stage. In some embodiments, timing the switch operation can ensure that the loading process for the next stage begins as soon as the current stage has completed the operation of the current stage.

In some embodiments, implementing feedback control within the switch and loading processes can help monitor and adjust timing and synchronization. Such feedback control can affect the loading time of the previous stage by ensuring that the switch occurs when the next stage is ready to receive data. In some embodiments, preloading data for the next stage can help reduce the time needed for data transfer. If the switch initiates as soon as the data is ready, such timing can reduce the loading time.

The differential capacitor (e.g., the capacitor 170) can be used for coarse frequency tuning. For example, by changing the capacitance of the differential capacitor 170, the IL-divider system 100 can be tuned to achieve the desired frequency having a wider range of a target frequency without implementing fine-tuning methods requiring more precise mechanisms for frequency synchronization or finely-tuned timing.

In some embodiments, a differential capacitor (or a varactor diode) can be a semiconductor device having a capacitance that is dependent on voltage. For example, the capacitance of a varactor diode can be controlled by altering the voltage applied to it. For example, increasing the voltage across the varactor diode can cause its capacitance to decrease, and conversely, decreasing the voltage leads to an increase in capacitance. In an injection-locked oscillator (ILO), varactor diodes can be integrated into the resonant circuit, alongside the inductor and fixed capacitors. In some embodiments, the varactors can provide coarse frequency tuning. By adjusting the voltage applied to the varactor diode, the capacitance within the resonant circuit changes, which, in turn, impacts the oscillator resonant frequency. The resonant frequency of the oscillator is inversely proportional to the square root of the product of inductance and capacitance. Therefore, varactor diodes can perform the initial coarse tuning before subsequent more precise frequency adjustments are performed for synchronization with the injection signal in the process of injection locking.

The differential capacitor 170 can improve the clock swing and jitter. The clock swing refers to the magnitude of the voltage variation in the clock signal. The differential capacitor 170 can be adjusted to tune the delay in the ring oscillator in the IL-divider system 100. Thus, the output frequency can be controlled and adjustment of the differential capacitor 170 can affect the clock swing. To meet the target frequency, the capacitance can be adjusted such that a smaller differential capacitance may lead to a reduced swing having smaller current consumption, while a larger capacitance can lead to an increased swing and an increased current consumption. Jitter refers to the variations in the timing of clock edges. When the output frequency is controlled using the differential capacitor 170, such control can reduce jitter. Jitter is associated with phase noise, and by stabilizing the oscillator frequency, the IL-divider system 100 can reduce variations in clock edge timing, resulting in lower jitter.

In some embodiments, there can be a different number of stages, number of phases in input and output signals, etc.

Figure 3:
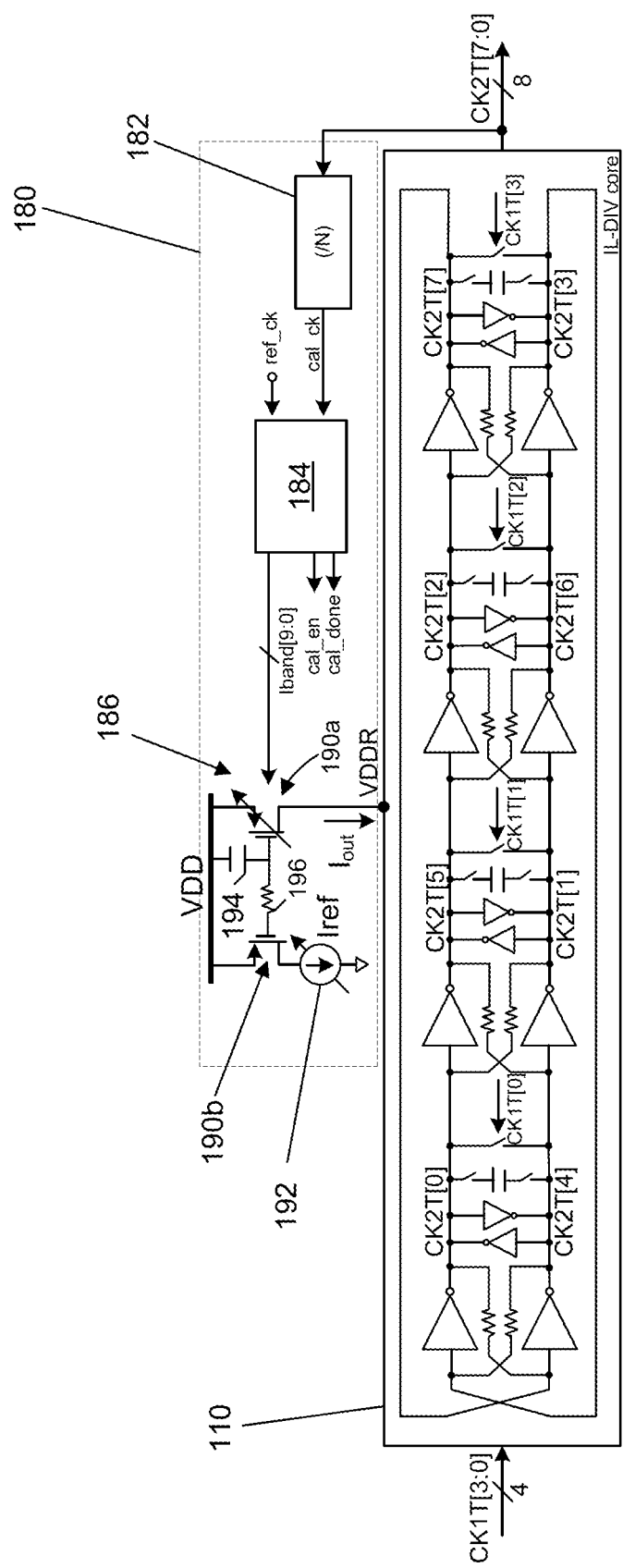
FIG. 3 illustrates an IL-divider having a frequency calibration, according to some embodiments.

FIG. 3 illustrates the IL-divider having a frequency calibration, according to some embodiments. In some embodiments, a calibration engine 180 can perform the frequency calibration. The frequency calibration engine 180 can include a calibration divider 182, a frequency calibrator 184, and a digital control current source (DCCS) 186. The calibration divider 182 can divide phases of the output signal CK2T[7:0] by a number N (e.g., dividing the number of the output phases by two). The DCCS 186 can include the reference current source 192 supplying reference current (Iref), a pair of transistors 190a, 190b, one or more capacitors 194, and one or more resistors 196.

In some embodiments, the calibration divider 182 can output a calibration divider clock signal (cal_ck) that can serve as an input for the frequency calibrator 184. The frequency calibrator 184 can receive a reference clock signal (ref_ck) that has a target frequency.

A frequency calibrator is a device used to measure and adjust the frequency of signals. The frequency calibrator is configured to generate a stable test signal with a known frequency and amplitude, which is then applied to the device under test. The device response to the test signal is then measured and compared with the expected response. Any discrepancies can be corrected by adjusting the device frequency or other settings until the device produces the desired result. This frequency calibration process ensures the accuracy and precision of the device frequency measurement and calibration, allowing the device to operate effectively.

Figure 9:
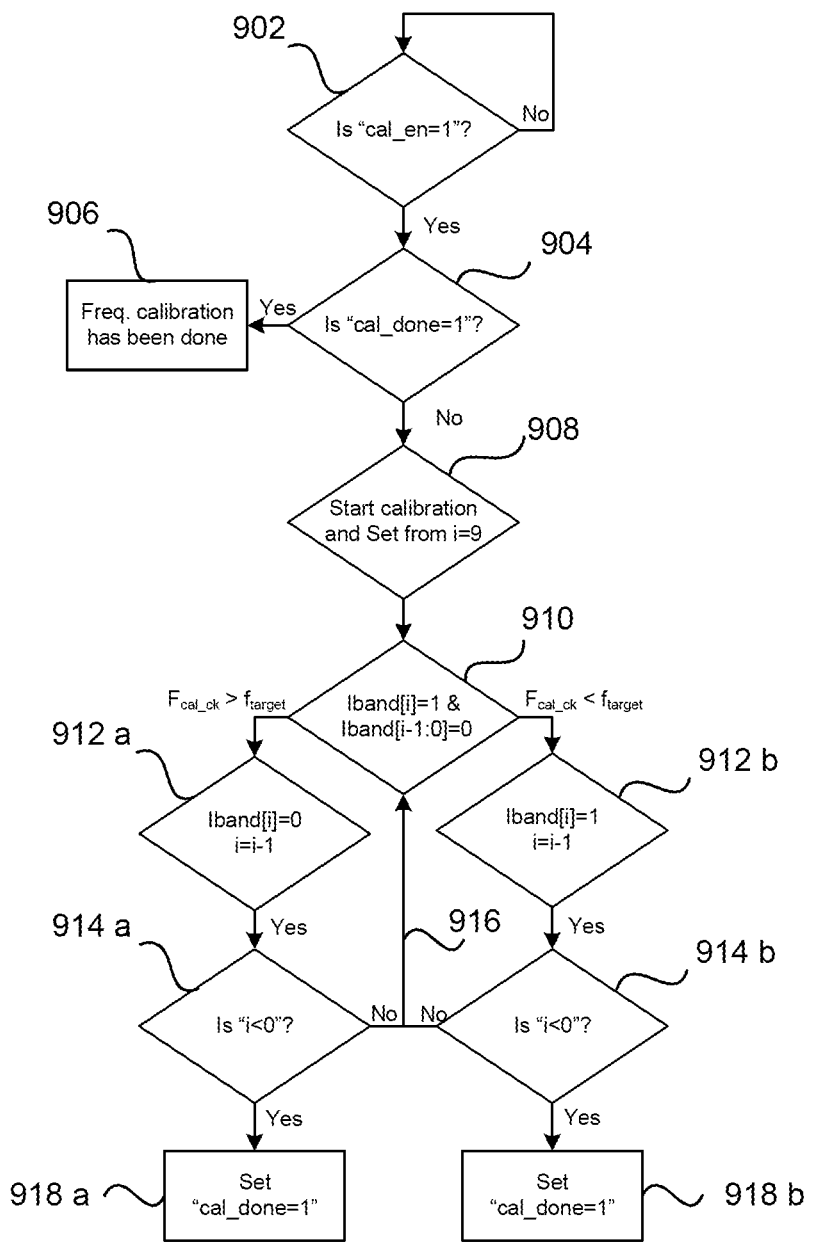
FIG. 9 illustrates a flowchart of a calibration method, according to some embodiments.

A brief reference is made to FIG. 9. A code (for example, "cal_en") provided by the frequency calibrator 184 can indicate when to start the frequency calibration before, e.g., an analog bias is ready. Analog bias refers to the introduction of a small, controlled voltage or current to set the operating point or quiescent point of an analog circuit. This biasing technique is used to enable functioning of the circuit components within their linear operating range and to reduce signal distortion.

When the calibration is complete, another code (for example, "cal_done") can be activated and start to inject the clock input signal CK1T[3:0] to the IL-divider system 100. As described with reference to FIG. 9, the frequency calibrator 184 performs a calibration of the signal cal_ck to adjust the signal cal_ck such that the signal cal_ck falls within a range corresponding to the target frequency of the signal ref_ck received by the frequency calibrator 184.

In some embodiments, the frequency calibrator 184 applies a code "Iband[9:0]" having, e.g., 10 bits corresponding to DCCS settings configured for separate system applications to overcome variations in the process and supply voltage (e.g., the PVT parameters).

In some embodiments, the temperature variation can be compensated by adjusting the reference current (Iref) or having the DCCS 186 configured to be based on temperature sensor information.

In some embodiments, the IL-divider core 110 with the current source 186 can prevent or reduce noise caused by the power supply VDD. In some embodiments, VDDR denotes the voltage supplied to the IL-divider core 110. The current source 186 coupled between VDD and VDDR can provide a constant current regardless of variations in load resistance and provide a stable current between VDD and VDDR. By using the current source 186 can enable the voltage division between VDD and VDDR to remain consistent. The current source 186 can have high input impedance, e.g., the current source 186 can draw relatively small current from the circuit between VDD and VDDR where the current source 186 is coupled. This can help maintain the accuracy of the voltage divider, as it won't significantly affect the circuit it's connected to. By controlling the current source 186, the current flowing through the divider network between VDD and VDDR can be determined. Such control of the current source 186 can enable a control the voltage levels at different points in the cascade architecture with a relatively high degree of accuracy. Using the current source 186 can provide isolation between different stages in the cascade, e.g., at a node where VDD is coupled and at a node where VDDR is coupled. Such isolation can reduce interference between these stages (where VDD and VDDR are coupled) and maintain signal integrity.

Figure 4:
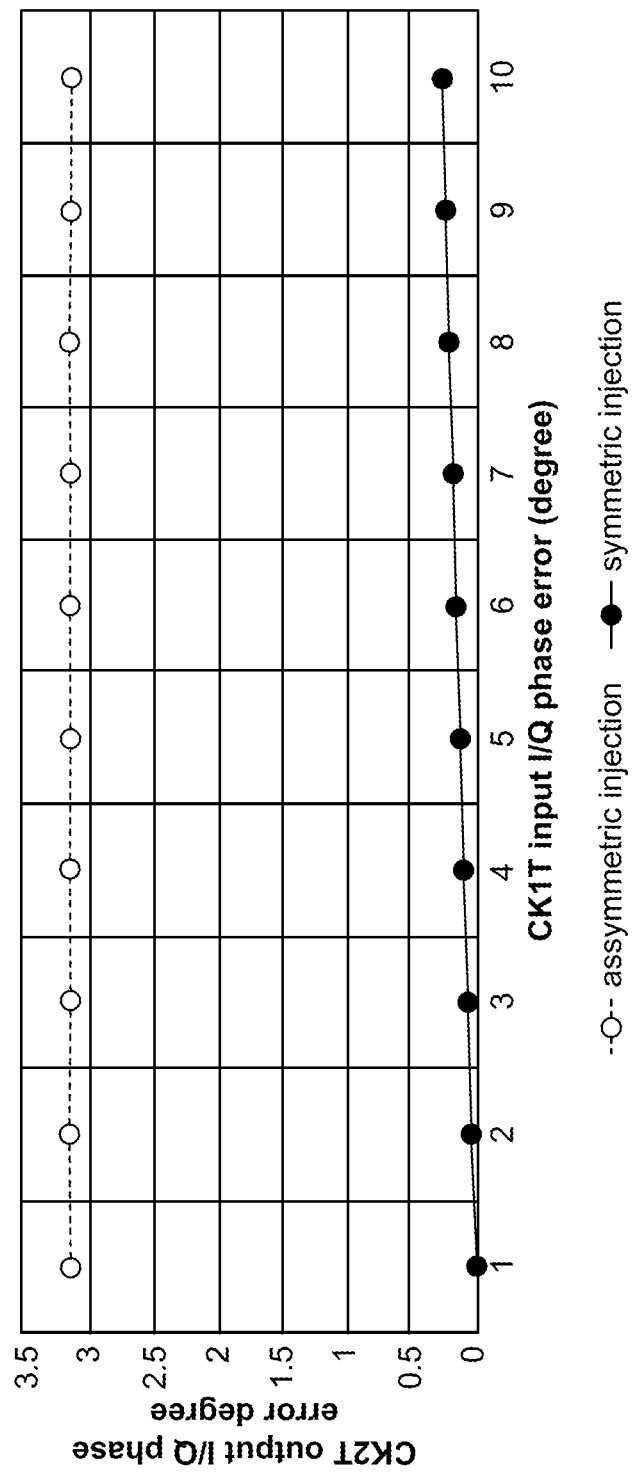
FIG. 4 illustrates an in-phase and quadrature (I/Q) skew reduction ratio implemented in an IL-divider system, according to some embodiments.

FIG. 4 illustrates an I/Q skew reduction ratio implemented in the IL-divider system 100, according to some embodiments. The I/Q skew at input signal, e.g., CK1T[3:0], is the dominant part of phase interpolator (PI) nonlinearity. The I/Q correction using the IL-divider system 100 improves the I/Q skew at IL-divider output signal, e.g., CK2T[7:0].

For example, the I/Q skew after IL-divider system 100 is reduced over ten times (using an absolute value of the CK2T output I/Q phase error). Symmetrical injection of IL-divider system 100 provides an improved cancellation of the I/Q skew over PVT variation.

Figure 5:
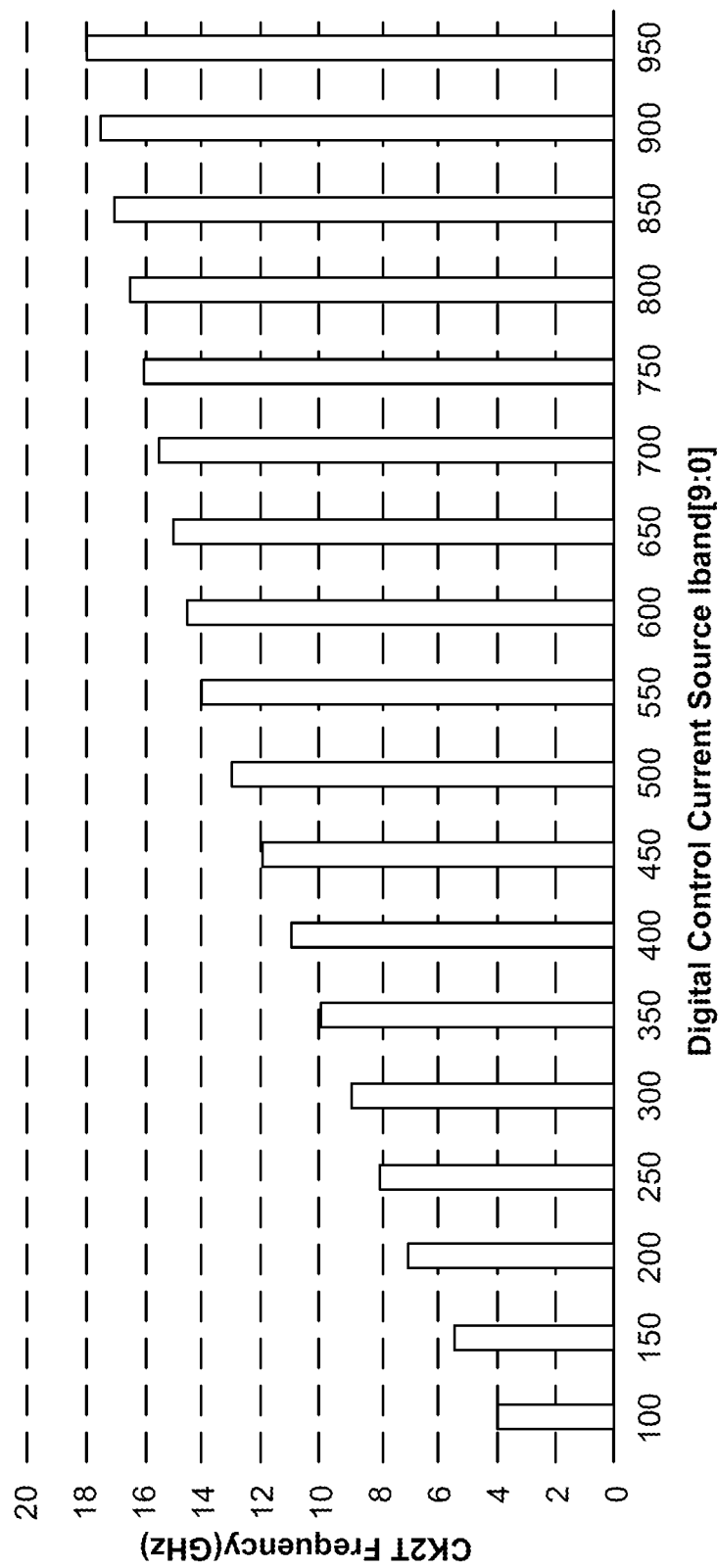
FIG. 5 illustrates the output signal frequency of an IL-divider system after frequency calibration, according to some embodiments.

FIG. 5 illustrates the output signal CK2T frequency of the IL-divider system 100 after frequency calibration, according to some embodiments. In some embodiments, the IL-divider system 100 with frequency calibration using DCCS 186 may extend operating range from 4 to 18 GHz. Without frequency calibration, the general locking range can be between −2 GHz and +2 GHz at a target frequency.

Figure 6:
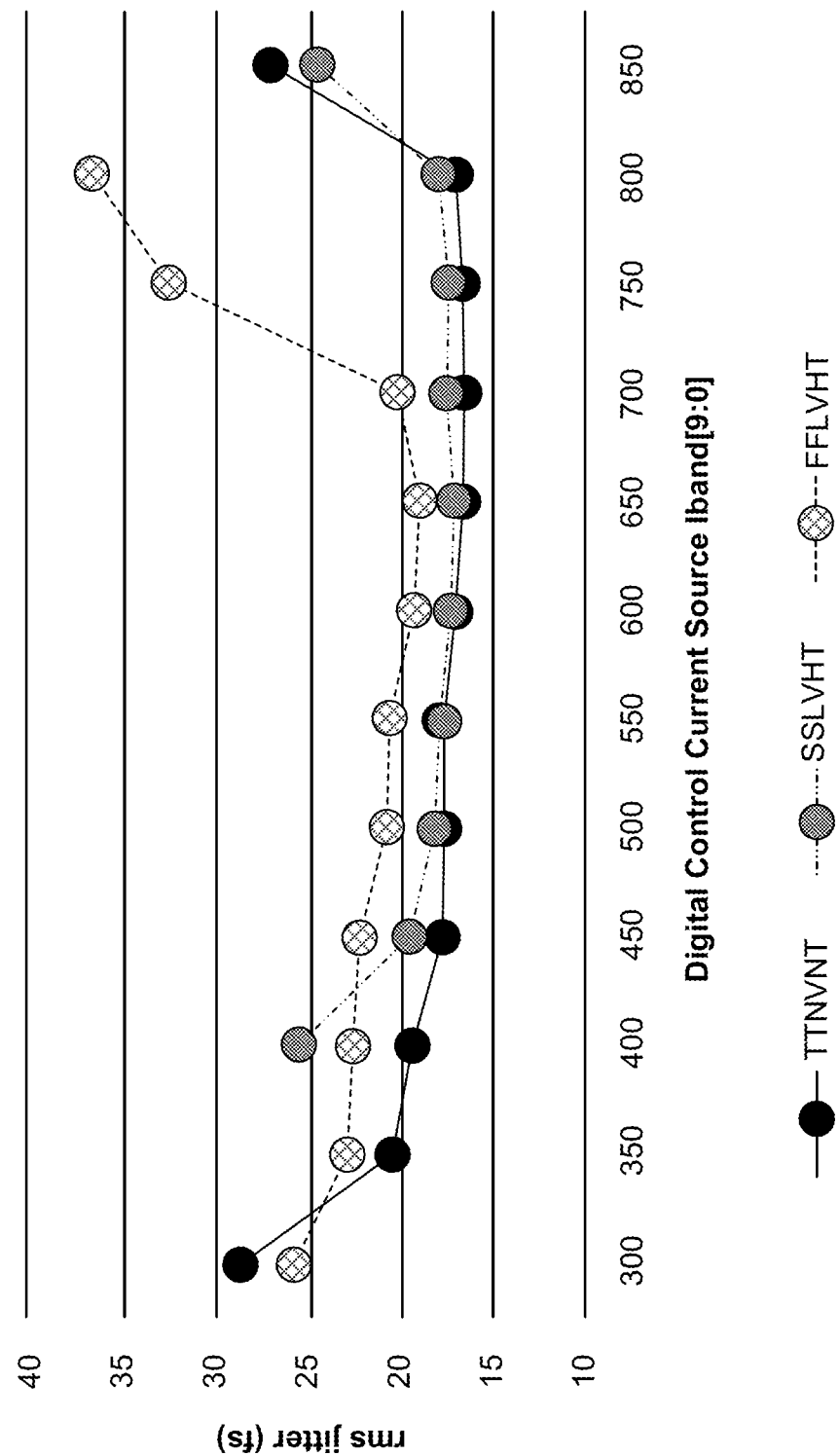
FIG. 6 illustrates jitter performance in an IL-divider system, according to some embodiments.

FIG. 6 illustrates jitter performance (for example, performance of root mean square (RMS) jitter) measured in, e.g., femtoseconds (fs) at 14 GHz frequency. After the frequency calibration, the IL-divider system 100 can set the Iband code to balance the jitter and power. For example, Iband[9:0] code can be set to 10'd550 at a typical process corner under nominal voltage and nominal temperature (TTNVNT). In some embodiments, Iband[9:0] code can be set to 10'd650 at a slow process corner under low voltage and high temperature (SSLVHT). In some embodiments, Iband[9:0] code can be set to 10'd500 at a fast process corner under low voltage and high temperature (FFLVHT).

Figure 7:
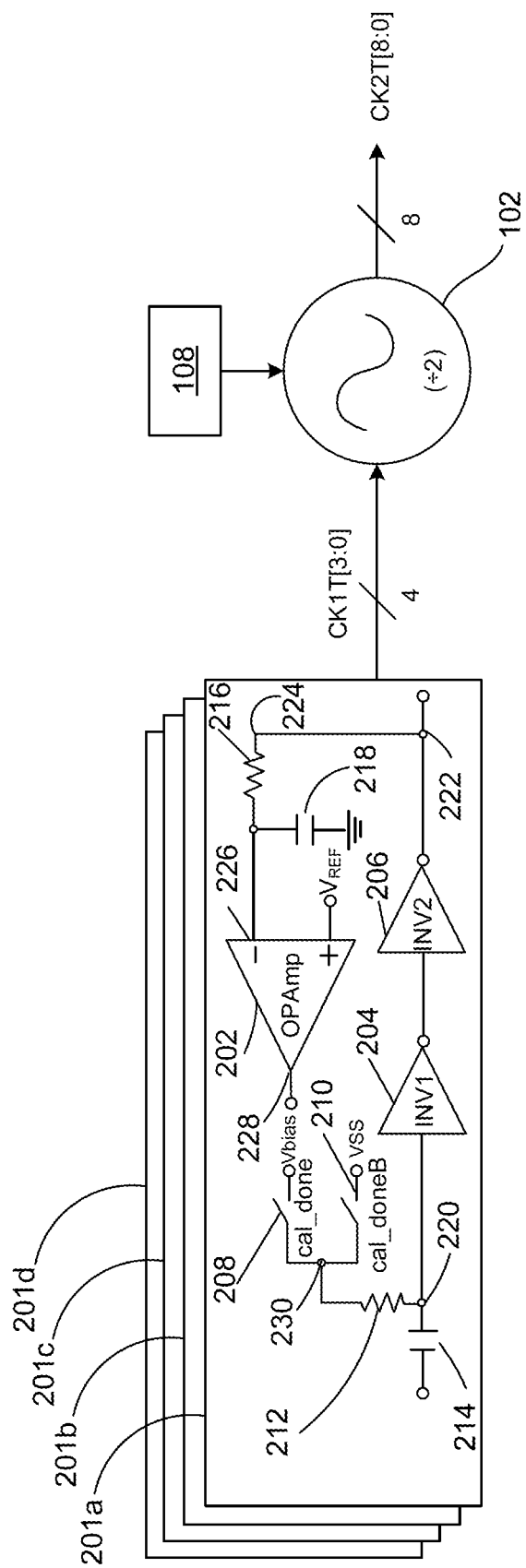
FIG. 7 illustrates an IL-divider system having one or more input duty cycle control loops, according to some embodiments.

FIG. 7 illustrates the IL-divider system 200 having one or more input duty cycle control loops 201. In some embodiments, the IL-divider system 200 can include a frequency calibration engine 108. In some embodiments, the IL-divider 102 can be symmetrical, e.g., the IL-divider 102 can have identical stages coupled in series.

The duty cycle control engine 106 (FIG. 1) can include a plurality of the duty cycle control loops 201a-201d corresponding to the number of input phases of the input signal CKIN. For example, the input signal CKIN can have four input phases. The duty cycle control engine 106 can have four duty cycle control loops 201a through 201d (as illustrated in FIG. 7). In some embodiments, the signal CK1T [3:0] can be output from the duty cycle control engine 106 and received by the IL-divider 102.

Each input duty cycle control loop 201 can include an amplifier 202 (e.g., an operational amplifier), a pair of resistors 212, 216, a pair of capacitors 214, 218, and a pair of switches 208, 210. A feedback loop can be configured by a loop corresponding to the nodes 220, 222, 224, 226, 228, and 230 of the duty cycle control loop 201. In some embodiments, a pair of inverters 204, 206 can be included in each buffer 104a-104d.

An amplifier, for example, an operational amplifier, abbreviated as op-amp, is a high-gain, voltage-differential amplifier with two inputs, termed the inverting (−) and non-inverting (+) inputs, and a single output. The op-amp can amplify the voltage difference between these two inputs. For example, the output voltage Vout of the op-amp can be equal to a result of multiplication of an open-loop gain A of the amplifier and a difference between V+ and V−, where V+ is the voltage at the non-inverting input, and V− is the voltage at the inverting input.

An inverting input of the amplifier 202 can be coupled in series with the resistor 216 and the inverters 204, 206, which are coupled in series with each other and a resistor 216. A non-inverting input of the amplifier 202 can be coupled to a reference voltage source VREF; an output of the amplifier 202 can be coupled to a bias voltage source Vbias. The bias voltage source Vbias can be coupled in parallel to a VSS voltage source (that can be, e.g., ground).

In some embodiments, the signal CK1T[3:0] can be designed to be CMOS rail-to-rail clock output with the duty cycle control engine 106. The switches 208 and 210 can be activated by instructions "cal_done" and "cal_doneB", respectively, that are received by the switches 208, 210 from the frequency calibration engine 108 (FIGS. 1 and 3). In an operative state of the duty cycle control loop 201, a signal having a corresponding phase of the signal CK1T[3:0] will be active after the "cal_done" is activated. Otherwise, the signal CK1T[3:0] stays at a low position until the frequency calibration is completed.

For example, during frequency calibration, the duty cycle control loop 201 is in an inoperative state and "cal_doneB" is activated and switch 210 is on, while switch 208 is off, and the signal CK1T[3:0] will be inactive, e.g., not sent from the plurality of the duty cycle control loops 201. During such inoperative state, the feedback loop (the loop corresponding to the nodes 220, 222, 224, 226, 228, and 230) is inactive because the node 230 is coupled to the VSS voltage source, which can correspond to the ground voltage. When the frequency calibration is complete the "cal_done" is activated and the feedback loop (the loop corresponding to the nodes 220, 222, 224, 226, 228, and 230) of the duty cycle control loop 201 is active (in the operable state) and the CK1T[3:0] signal is sent by the plurality of the duty cycle control loops 201 and the signal CK1T[3:0] is received by the IL-divider 102.

An amplitude to phase modulation (AM to PM) effect occurs when the phase of a signal is modulated by variations in the amplitude of the signal. The AM to PM effect can be caused by non-linear components in a signal path or imperfections in modulation processes. When these amplitude variations occur, they introduce phase distortions in the signal. A fixed swing input refers to a relatively constant, unchanging amplitude level of the input signal. During the fixed swing input, the amplitude of the modulating signal remains relatively constant over time. A fixed swing input for the IL-divider 102 can reduce the AM to PM effect and reduce a locking range variation of the IL-divider 102. When the input signal has a fixed swing or a constant amplitude, the AM to PM effect is generally minimal because there are no variations in the input signal amplitude to induce changes in phase.

Figure 8:
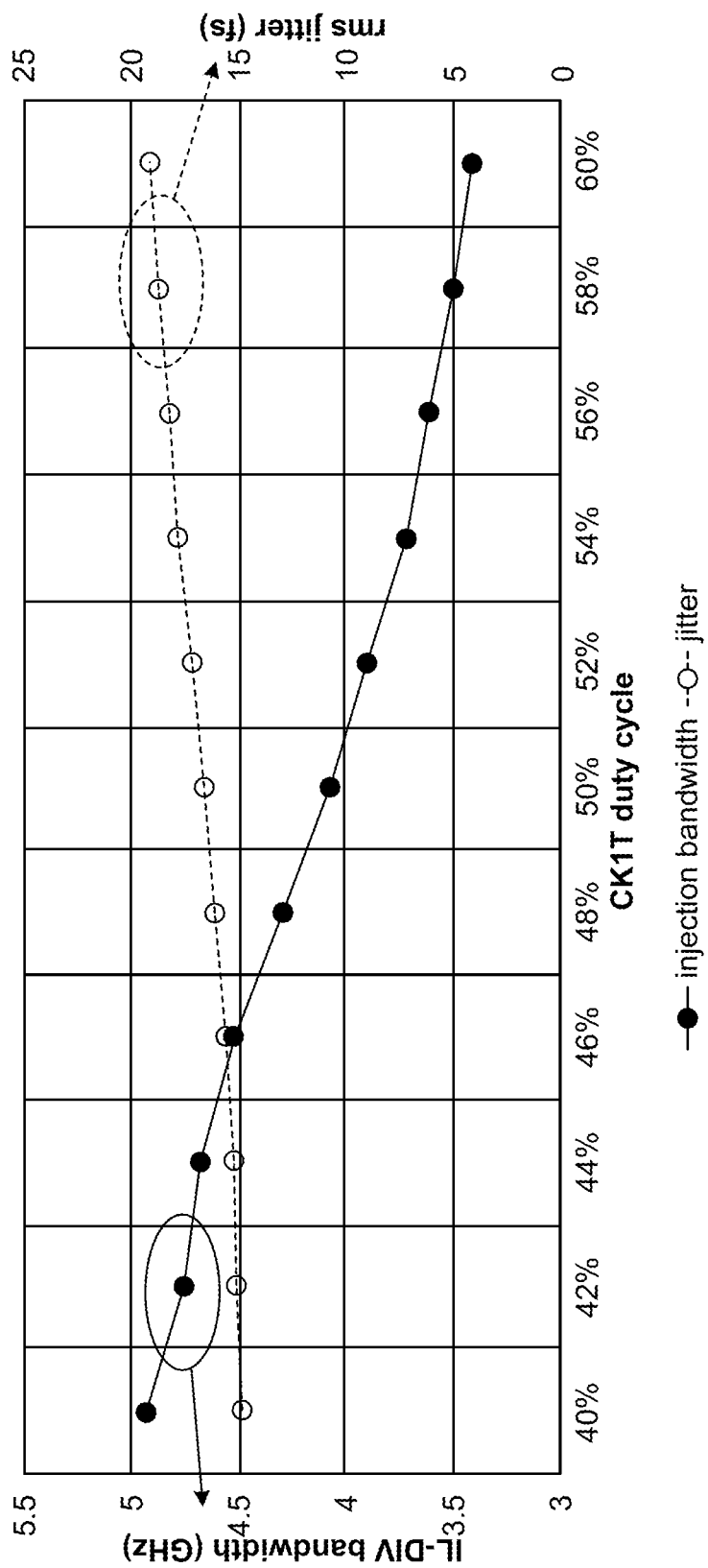
FIG. 8 illustrates a bandwidth and jitter performance of an IL-divider having different duty cycles of the input signal, according to some embodiments.

In some embodiments, the duty cycle control loop 201 of the input signal CK1T[3:0] can be programmable to adjust the locking range (as illustrated in FIG. 8). In some embodiments, the duty cycle control loop 201 can be programmable to adjust injection strength of switch 168 (FIG. 1) that calibrates the output signal CK2T[7:0].

The duty cycle control loop 201 can suppress the PN device mismatch and aging effect to maintain CK1T[3:0] signal quality. For example, by adjusting the voltage VREF, the output clock duty cycle can be determined. The duty cycle represents the ratio of time a signal is in an active state (high) to the total period of the signal. By adjusting VREF, the reference voltage level can be changed for the components involved in generating the clock signal. Such change in the voltage for the components can affect the timing of when the signal transitions between high and low states of the clock signal, thus, influencing the duty cycle.

FIG. 8 illustrates a bandwidth and jitter performance of the IL-divider 102 having different duty cycles of the input signal CK1T. In some embodiments, a different duty cycle of the input signal CK1T can provide different results for IL-divider bandwidth and jitter results as illustrated in FIG. 8. In some embodiments, the duty cycle adjustability provides benefits from fine-tuning the ILRO performance.

In some embodiments, for the second order harmonic injection architecture, the larger duty cycle degrades IL-divider jitter and bandwidth. The IL-divider systems 100, 200 provide various circuit advantages.

The IL-divider systems 100, 200 based on the DCCS 186 provides power supply rejection (power supply rejection ratio, PSRR) and a wide frequency range. The PSRR quantifies the ability of a circuit to reject or attenuate variations in the power supply voltage. The PSRR measures the device ability to maintain the device performance or output in the presence of changes or noise in the power supply voltage.

The IL-divider systems 100, 200 can provide robust jitter and skew reduction across the PVT and PN mismatch. Because adjustment is done via a digital control, therefore the results of adjustment are not so sensitive to the mismatch.

The IL-divider systems 100, 200 can provide a less driving ability requirement to IL-divider input clock for power saving. The term "driving ability" refers to the capability of an electronic circuit or component to provide a signal with the required characteristics to effectively operate another component or subsystem. For example, in the context of an injection-locked divider input clock, driving ability relates to the strength and quality of the clock signal being delivered to the IL divider. The driving ability includes factors such as the signal voltage level, ability of the signal to maintain a stable and accurate frequency, and capacity of the signal to overcome impedance mismatches and signal degradation over transmission lines. The driving ability encompasses the signal ability to "drive" or properly operate the input of the injection-locked divider, facilitating the injection-locked divider to receive a relatively clean, synchronized, and reliable clock signal. The IL-divider systems 100, 200 can lower such driving ability requirements while reducing the power requirements to perform such driving ability.

In some embodiments, the driving ability (or drive strength) in an oscillator can refer to oscillator ability to counteract the impact of capacitive loading (or capacity loading) and other external factors that may otherwise disrupt stable oscillation of the oscillator (e.g., IL-divider 100, 200). When an oscillator is subjected to capacitive loading, the oscillator experiences changes in electrical characteristics of the oscillator. Capacitors add an extra load to the oscillator circuit, affecting resonant frequency and overall performance of the oscillator. The drive strength of the oscillator enables the oscillator to maintain oscillation when experiencing with changes in the capacity (or capacitance) loading.

In some embodiments, adjustment of the IL-divider bandwidth and jitter can be performed by changing the duty cycle of the IL-divider systems 100, 200. The IL-divider systems 100, 200 provide various advantages for the systems implementing the IL-divider systems 100, 200. For example, the IL-divider systems 100, 200 can improve jitter tolerance of the receiver systems, effective number of bits (ENOB), and signal-to-noise and distortion ratio (SNDR). ENOB is a measure of how many bits of resolution are achievable in an analog-to-digital conversion. Reduced jitter leads to more precise and stable clocking of the analog-to-digital converter (ADC). SNDR quantifies the quality of the output signal compared to the noise and distortion. Lower jitter can lead to a better SNDR through several mechanisms, e.g., reduction of aperture jitter and lower noise floor. Aperture jitter refers to the uncertainty in the sampling instant. Reducing jitter in the sampling clock can reduce aperture jitter, improving the accuracy of analog-to-digital conversion. Jitter-induced noise can be observed as an added noise floor in the system. By reducing jitter, the added noise floor can be lowered, resulting in a cleaner signal and an improved SNDR.

The IL-divider systems 100, 200 provide various advantages for the products implementing the IL-divider systems 100, 200. In some embodiments, the IL-divider systems 100, 200 can be scalable to a wide frequency range covering various communication standards. For example, the IL-divider systems 100, 200 can improve data rate and speed. In comparison to other systems not implementing the features of the IL-divider systems 100, 200, the systems described herein can extend the channel reach to longer distances by reducing the clock jitter. In some embodiments, the IL-divider systems 100, 200 can provide lower consumption of power and area.

In some embodiments, multi-phase clock generation or clock skew compensation method can be implemented by the IL-divider systems 100, 200, e.g., in time-interleaved analog-to-digital converters (ADC) applications. The IL-divider systems 100, 200 can at least partially mitigate challenges of multiple phase clock distribution, e.g., an amplitude and phase mismatch, which can be sensitive to process, temperature, and voltage. The IL-divider systems 100, 200 can at least partially compensate or reduce the phase mismatch between the multi-phase clocks. The IL-divider systems 100, 200 can at least partially improve the clock jitter performance after long channel distribution or multiple stage cascade.

The IL-divider systems 100, 200 can be implemented using an injection locked circuit (e.g., an oscillator or divider); such circuit can be calibrated relatively straight-forwardly. For an improved locking range and phase correction of the injection locked circuit, frequency calibration can be utilized. For example, multiple phase interpolators (PIs) and injection-locked circuit calibration can be implemented by the IL-divider systems 100, 200.

In some embodiments, the IL-divider systems 100, 200 can have different chip measurements at the receiver ADC output in comparison to other ILRO systems, which do not implement the IL-divider systems 100, 200.

Generally, an I/Q path (even and odd path) mismatch information may be available. The architecture of the IL-divider systems 100, 200 provides instant or near instant recovery of the I/Q skew while other ILRO systems (e.g., asymmetric ILRO systems) may not provide consistent performance under the different external conditions.

In some embodiments, the chip having the IL-divider systems 100, 200 when operated with different operation rate (or VCO frequency), the I/Q path mismatch may occur from even or odd ADC output. The architecture having the IL-divider systems 100, 200 provides a consistent I/Q path matching. Some frequency tuning methods, which do not implement the IL-divider systems 100, 200, may have a noticeable I/Q path matching degradation for wide frequency operation.

In the IL-divider systems 100, 200, a noise floor of an ADC spectrum may be different over a different process corner of the semiconductor chip. A Slow-Slow (SS) corner can provide higher noise floor than a typical (TT) corner. The architecture of the IL-divider systems 100, 200 can set the calibrated code for the IL-divider systems 100, 200 to provide an improved noise floor in each corner. In some embodiments, there is substantially no noise floor difference in the SS and TT corners over process variation.

In some embodiments, the inductor from the VCO and distributed clock routing can be traced to each lane of the semiconductor chip. The architecture of the IL-divider systems 100, 200 can utilize the symmetric injection locked divider, symmetrical placement of input and output clock routing may be present in each lane. In some embodiments, the digital control current source (DCCS) may have a relatively large active device area and a passive low-pass filter, in comparison to other clock buffers.

A high-performance multi-phase clock path is used for high-speed transceiver applications. When the clock runs at a high speed, the system is more sensitive to jitter in the clock path. The skew mismatch of the multi-phase clock may be worse at the higher clock speed. The injection locked oscillator or divider can be an efficient and low-cost solution to improve the jitter and power.

The IL-divider systems 100, 200 can be used in high performance multi-phase clock generation. The IL-divider systems 100, 200 and method 1000 described herein can be implemented in network switches, computer systems of data centers, high speed physical layer, coherent optical transceiver, systems performing 5G, 6G, Next-G, or microwave wideband data capturing.

For example, in networking application, such as data centers and telecommunications, high bandwidth and high data-rate can be utilized. The high-speed communication can be between network devices, such as switches, routers, and servers. High-speed serializers and deserializers enable a faster and more efficient data exchange, enabling a relatively seamless flow of information across networks.

In artificial intelligence (AI) applications, such as deep learning and neural networks, large amounts of data can be processed quickly and efficiently. In comparison to other devices not implementing the IL-divider systems 100, 200, the serializers and deserializers utilizing the IL-divider systems 100, 200, which may operate at 200 Gbps, 400 Gbps, and 800 Gbps transfer rates, enable effective operation of the high-performance computing systems, enabling a relatively fast data exchange between GPUs, accelerators, and storage device. This enables a rapid training and inference of complex AI models, improving the overall performance and efficiency of AI systems.

FIG. 9 is flowchart of an example process 900. In some implementations, one or more process blocks of FIG. 9 may be performed by the IL-divider system 100, 200. The IL-divider system 100, 200 may have a series of symmetrical stages, as described above.

As shown in FIG. 9, process 900 may include a method for calibrating the signal of the IL-divider system 100, 200. In some embodiments, the code cal_en is provided by the frequency calibrator 184 (FIG. 3) to start the frequency calibration by the frequency calibration engine 180 (block 902). In some embodiments, method 900 checks whether calibration is complete, e.g., if the code cal_done is activated (block 904). The frequency calibration is stopped if the code cal_done is activated (block 906).

In some embodiments, if the code cal_done is not activated, then the frequency calibrator 184 initiates a calibration of the signal cal_ck signal that is received from the calibration divider 182 (block 908). In some embodiments, the frequency calibrator 184 applies a code Iband[9:0] that is equal to one (1) and i equals to nine (9) (blocks 908, 910).

In some embodiments, the signal cal_ck is adjusted such that the signal cal_ck falls within a range corresponding to the target frequency $f_{target}$ of the ref_ck signal received by the frequency calibrator 184. If the frequency $F_{cal\_ck}$ of the cal_ck signal is greater than the target frequency $f_{target}$, then index i is decremented by one (1), e.g., index i equals eight (8) and the Iband[9:0] code is set to one (1) (block 910). If the frequency $F_{cal\_ck}$ of the cal_ck signal is lesser than the target frequency $f_{target}$, then index i is decremented by one, e.g., index i equals eight (8) and the Iband[9:0] code is set to zero (0) (block 910).

If after performing step 910, the frequency $F_{cal\_ck}$ of the signal cal_ck is greater than the target frequency $f_{target}$, then index i is decremented by one (1), e.g., index i equals seven (7) and the Iband[9:0] code is set to zero (0) (block 912a). If the frequency $F_{cal\_ck}$ of the signal cal_ck is lesser than the target frequency $f_{target}$, then index i is decremented by one (1), e.g., index i equals seven (7) and the Iband[9:0] code is set to one (1) (block 912b).

The process of decrementing index i and setting Iband[9:0] to different values continues until index i reaches zero (0), e.g., further decrementing index i by one (1) results in index i being less than zero (0) (blocks 914a-b). If such condition is not met (e.g., decrementing index i by one (1) does not result in index i being less than zero (0)), then an iterative process of decrementing index i by one (1) and setting Iband[9:0] to different values continues (arrow 916). Otherwise, if decrementing index i by one (1) results in index i being less than zero (0), then the calibration is complete (blocks 918*a-b*). When the calibration is complete, the code cal_done can be activated to stop calibration inside the frequency calibration engine 180.

Although FIG. 9 shows example blocks of process 900, in some implementations, process 900 may include additional blocks, fewer blocks, different blocks, or differently arranged blocks than those depicted in FIG. 9. In some embodiments, two or more of the blocks of process 900 may be performed in parallel.

Figure 10:
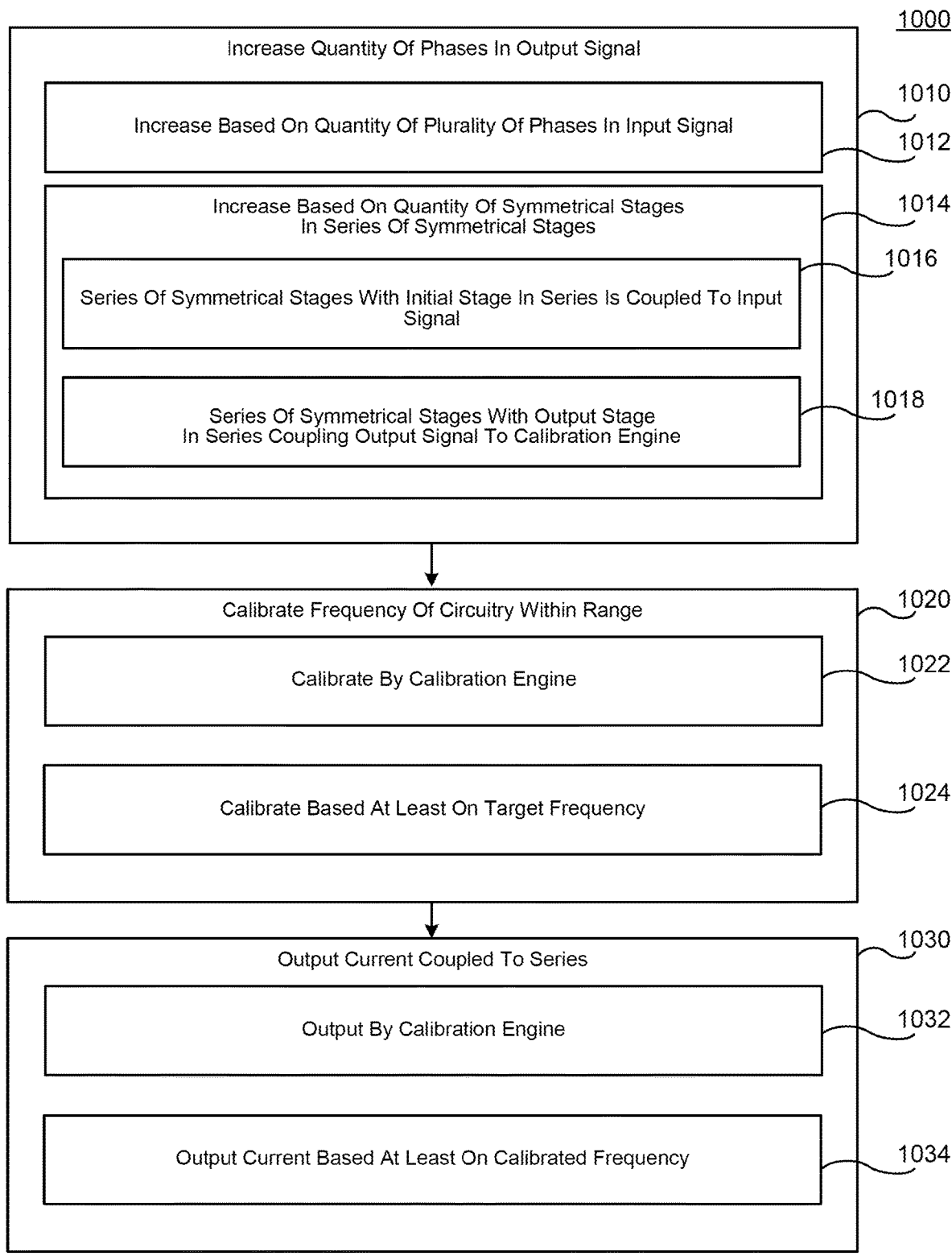
FIG. 10 illustrates a flowchart of an example process of a method for calibration, according to some embodiments.

FIG. 10 is a flowchart of an example process 1000. In some implementations, one or more process blocks of FIG. 10 may be performed by the IL-divider system 100, 200. The IL-divider system 100, 200 may have a series of symmetrical stages, as described above.

As shown in FIG. 10, process 1000 may include a method increasing a quantity of phases in an output signal comprising a first plurality of phases (block 1010). As also shown in FIG. 10, process 1000 may include a method, where increasing the quantity of phases in the output signal is based on a second plurality of phases in an input signal (block 1012). As shown in FIG. 10, process 1000 may include a method where increasing the quantity of phases in the output signal is based on a quantity of symmetrical stages in a series of the symmetrical stages (block 1014). In some embodiments, the series of the symmetrical stages with an initial stage in the series can be coupled to the input signal (block 1016). In some embodiments, the series of the symmetrical stages can be coupled to an output stage in the series of symmetrical stages coupling the output signal to a calibration engine where the output signal comprises the first plurality of phases (block 1018).

As shown in FIG. 10, process 1000 may include a method calibrating a frequency of a circuitry within a range (block 1020). In some embodiments, calibrating the frequency of the circuitry can be performed by the calibration engine (block 1022). The range of frequencies can be based at least on a target frequency (block 1024).

As shown in FIG. 10, process 1000 may include a method outputting a current coupled to the series (block 1030). In some embodiments, outputting the current can be performed by the calibration engine (block 1032). In some embodiments, the output current can be based at least on a calibrated frequency (block 1034).

Process 1000 may include additional implementations, such as any single implementation or any combination of implementations described below or in connection with one or more other processes described elsewhere herein. In first implementation, process 1000 further includes sending, by a frequency calibrator of the calibration engine, instructions to a circuitry of the current source. In some embodiments, the instructions can be based at least on the calibrated frequency. In some embodiments, the method can include transmitting, by a current source to the frequency calibrator, the current to the circuitry, where the current can be based at least on the calibrated frequency.

Although FIG. 10 shows example blocks of process 1000, in some implementations, process 1000 may include additional blocks, fewer blocks, different blocks, or differently arranged blocks than those depicted in FIG. 10. In some embodiments, two or more of the blocks of process 1000 may be performed in parallel.

The following IEEE standard(s), including any draft versions of such standard(s), are hereby incorporated herein by reference in their entirety and are made part of the present disclosure for all purposes: IEEE 802.3, IEEE 802.11x, IEEE 802.11ad, IEEE 802.11ah, IEEE 802.11aj, IEEE 802.16 and 802.16a, and IEEE 802.11ac. In addition, although this disclosure may reference aspects of these standard(s), the disclosure is in no way limited by these standard(s).

Figure 11A:
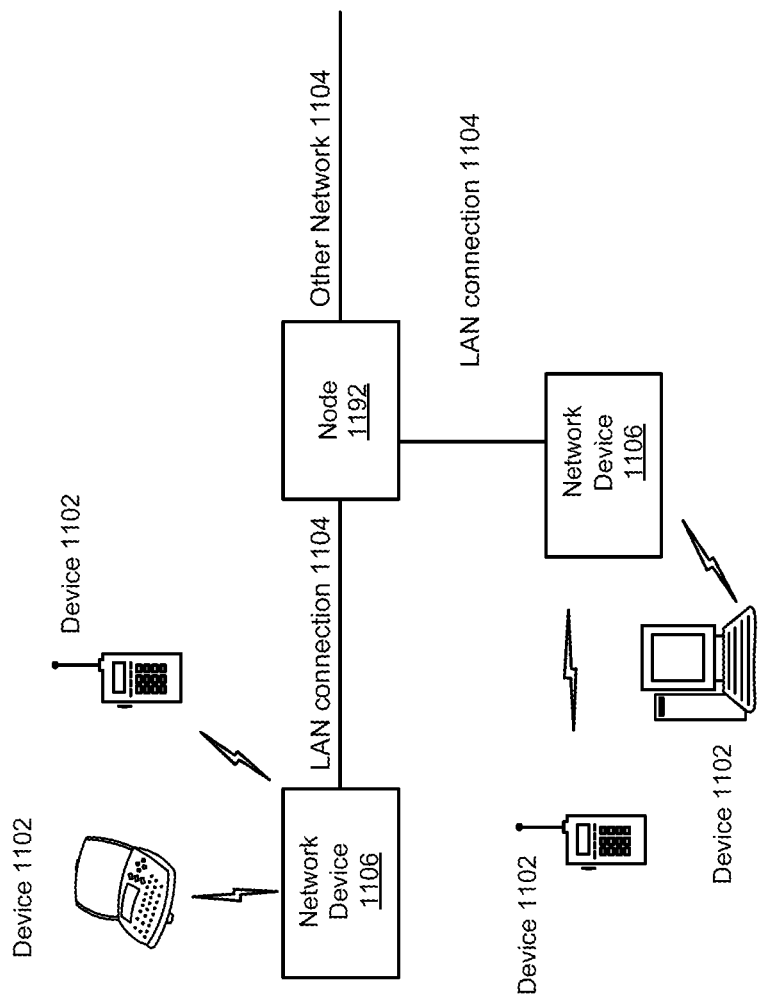
FIGS. 11A and 11B depict block diagrams of a computing device useful for practicing an embodiment of the client device or network device, according to some embodiments.

Having discussed specific embodiments of the present solution, it may be helpful to describe aspects of the operating environment as well as associated system components (e.g., hardware elements) in connection with the methods and systems described herein. Referring to FIG. 11A, an embodiment of a network environment is depicted. The network may include or be in communication with one or more storage area networks (SANs), security adapters, or Ethernet converged network adapters (CNAs). In brief overview, the network environment includes a communication system that includes one or more network devices 1106, one or more client devices 1102 and a network hardware component 1192. In some embodiments, the network device 1106 can be an access point (AP). In some embodiments, the client device 1102 can be a wireless communication device. For example, the client devices 1102 may include laptop computers 1102, tablets 1102, personal computers 1102, wearable devices 1102, vehicles 1102 (e.g., automobiles, drones, smart vehicles, robotic units, and the like), video game consoles 1102, cellular telephone devices 1102, smart TV sets 1102, Internet of Thing (IoT) devices 1102, and any other electronic devices 1102 capable of wireless communication. The details of an embodiment of client devices 1102 and network device 1106 are described in greater detail with reference to FIGS. 11B and 11C. The network environment can be an ad hoc network environment, an infrastructure wireless network environment, a wired network coupled to a wireless network, a subnet environment, or a combination of the foregoing, in one embodiment.

The term "coupled," and variations thereof includes the joining of two members directly or indirectly to one another. The term "electrically coupled" and variations thereof includes the joining of two members directly or indirectly to one another through conductive materials (e.g., metal or copper traces). Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The network devices 1106 may be operably coupled to the network hardware 1192 via local area network connections. The network hardware 1192, which may include one or more routers, gateways, switches, bridges, modems, system controllers, appliances, and the like, may provide a local area network connection for the communication system. Each of the network devices 1106 may have an associated antenna or an antenna array to communicate with the client devices in its area. The client devices may register with a particular network device 1106 to receive services from the communication system (e.g., via a SU-MIMO or MU-MIMO configuration). For direct connections (i.e., point-to-point communications), some client devices may communicate directly via an allocated channel and communications protocol. Some of the client devices 1102 may be mobile or relatively static with respect to the network device 1106.

In some embodiments, a network device 1106 includes a device or module (including a combination of hardware and software) that enables the connection of client devices 1102 to wired or wireless networks. The network device 1106 is oriented towards wired connections and is also designed to support wireless connections. The configuration and design of the network device 1106 enables communication of the network device 1106 with controllers and storage devices established through wired links. A network device 1106 may connect to a router (e.g., via a wired network) as a stand-alone device in some embodiments. In other embodiments, a network device 1106 can be a component of a router. A network device 1106 can provide multiple devices access to a network. A network device 1106 may, for example, connect to a wired Ethernet connection and provide wireless connections using radio frequency links for other devices 1102 to utilize that wired connection. A network device 1106 may be built and configured to support a standard for sending and receiving data using one or more radio frequencies. Those standards and the frequencies they use may be defined by the IEEE (e.g., IEEE 802.11 standards). A network device 1106 may be configured and used to support public Internet hotspots and on an internal network to extend the network's Wi-Fi signal range.

In some embodiments, the network devices 1106 may be used for in-home or in-building wireless networks (e.g., IEEE 802.11, Bluetooth, ZigBee, any other type of radio frequency-based network protocol or variations thereof). Each of the client devices 1102 may include a built-in radio or be coupled to a radio. Such client devices 1102 and network devices 1106 may operate in accordance with the various aspects of the disclosure as presented herein to enhance performance, reduce costs or size, and enhance broadband applications. Each client device 1102 may have the capacity to function as a client node seeking access to resources (e.g., data, and connection to networked nodes such as servers) via one or more network devices.

The network connections may include any type or form of network and may include any of the following: a point-to-point network, a broadcast network, a telecommunications network, a data communication network, or a computer network. The topology of the network may be a bus, star, or ring network topology. The network may be of any such network topology as known to those ordinarily skilled in the art and capable of supporting the operations described herein. In some embodiments, different types of data may be transmitted via different protocols. In other embodiments, the same types of data may be transmitted via different protocols.

Figure 11B:
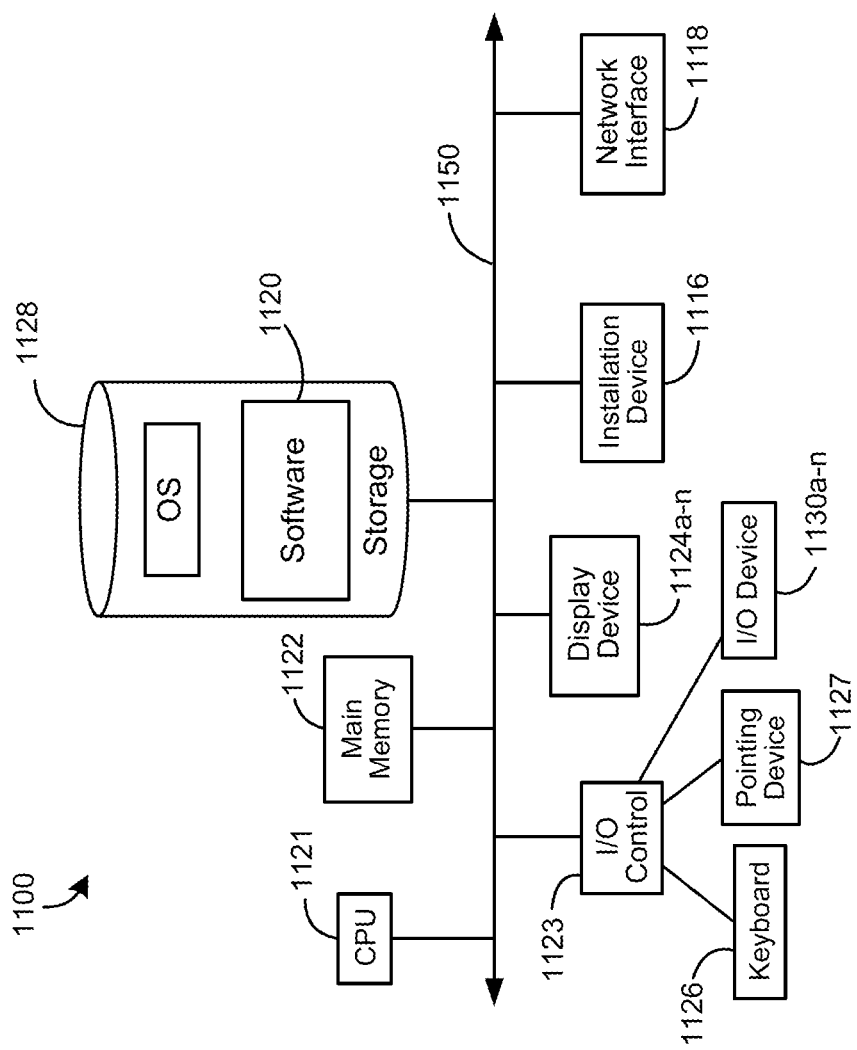
Figure 11C:
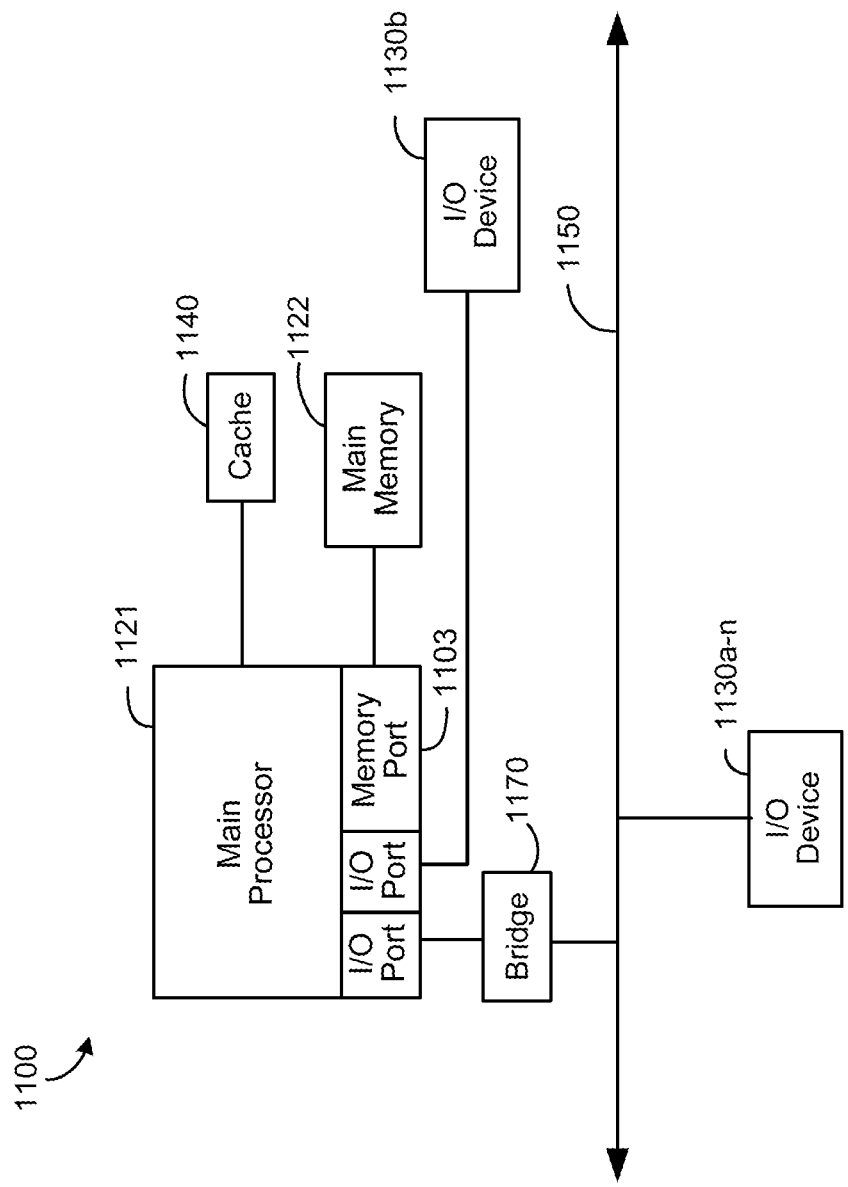
FIG. 11C depicts an embodiment of a computing device in which the processor communicates directly with main memory via a memory port, according to some embodiments.

The client device(s) 1102 and network device(s) 1106 may be deployed as or executed on any type and form of computing device, such as a computer, network device, or appliance capable of communicating on any type and form of network and performing the operations described herein. FIGS. 11B and 11C depict block diagrams of a computing device 1100 useful for practicing an embodiment of the client device 1102 or network device 1106. As shown in FIGS. 11B and 11C, each computing device 1100 includes a central processing unit 1121, and a main memory or main memory unit 1122. As shown in FIG. 11B, a computing device 1100 may include a storage device 1128, an installation device 1116, a network interface 1118, an I/O controller 1123, display devices 1124a-1124n, a keyboard 1126 and a pointing device 1127, such as a mouse. The storage device 1128 may include, without limitation, an operating system or software. As shown in FIG. 11C, each computing device 1100 may also include additional optional elements, such as a memory port 1103, a bridge 1170, one or more input/output (I/O) devices 1130a-1130n (generally referred to using reference numeral 1130), and a cache memory 1140 in communication with the central processing unit 1121.

"Circuitry" can refer to the interconnected arrangement of electronic components and pathways that allow the flow of electrical signals within a device, system, or application. In some embodiments, a single component circuitry can be an electronic component such as a resistor, capacitor, or transistor that performs a certain function within an electronic system. In some embodiments, multiple components working together in circuitry can include coordination of various electronic components. In some embodiments, the circuitry can include hardware components, such as integrated circuits, transistors, resistors, capacitors, and connectors, as well as combinations of hardware and software or firmware elements that can operate together to perform various functions. The multiple components can include separate components such as sensors, microcontrollers, memory modules, communication interfaces, or power management circuits, which are interconnected to form a functional system. For example, the circuitry can include microcontrollers or processors that execute software instructions to control the behavior of the hardware components. For example, the circuitry processors can run programs that enable the device or system to perform various tasks such as data processing and communication. The components may not be physically contained within the same device, for example, the components can be distributed across different devices connected through wired or wireless interfaces.

The central processing unit (CPU) 1121 is any logic circuitry that responds to and processes instructions fetched from the main memory unit 1122. In many embodiments, the central processing unit 1121 is provided by a microprocessor unit, such as those manufactured by Intel Corporation of Mountain View, California; those manufactured by International Business Machines of White Plains, New York; or those manufactured by Advanced Micro Devices of Sunnyvale, California. The computing device 1100 may be based on any of these processors or any other processor capable of operating as described herein. The CPU can be a programmable parallel processor.

Other programmable parallel processors can include a graphics processing unit (GPU) and a neural processor. The GPU is a programmable parallel processor that can perform complex computations for graphics rendering and general-purpose computing tasks. The GPU consists of processing cores interconnected through a high-bandwidth memory interface and a bus system, enabling efficient parallel processing. The processing core of the GPU can be equipped with dedicated arithmetic logic units and memory caches, allowing for simultaneous execution of multiple computational threads. To optimize graphics rendering pipelines, the GPU can incorporate the following hardware components: texture units and rasterizers. The GPU can employ optimized algorithms and data parallelism techniques to accelerate computations, resulting in superior performance compared to a conventional CPU. The GPU can be programmable using graphics APIs and parallel computing frameworks, enabling scientific simulations, machine learning, and data analytics.

Main memory unit 1122 may be one or more memory chips capable of storing data and allowing any storage location to be accessed by the microprocessor 1121, such as any type or variant of Static random-access memory (SRAM), Dynamic random-access memory (DRAM), Ferroelectric RAM (FRAM), NAND Flash, NOR Flash and Solid-State Drives (SSD). The main memory 1122 may be based on any of the above-described memory chips, or any other available memory chips capable of operating as described herein. In the embodiment shown in FIG. 11B, the processor 1121 communicates with main memory 1122 via a system bus 1150 (described in more detail below). FIG. 11C depicts an embodiment of a computing device 1100 in which the processor communicates directly with main memory 1122 via a memory port 1103. For example, in FIG. 11C the main memory 1122 may be DRAM.

FIG. 11C depicts an embodiment in which the main processor 1121 communicates directly with cache memory 1140 via a secondary bus, sometimes referred to as a backside bus. In other embodiments, the main processor 1121 communicates with cache memory 1140 using the system bus 1150. Cache memory 1140 has a faster response time than main memory 1122 and is provided by, for example, SRAM, BSRAM, or EDRAM. In the embodiment shown in FIG. 11C, the processor 1121 communicates with various I/O devices 1130 via a local system bus 1150. Various buses may be used to connect the central processing unit 1121 to any of the I/O devices 1130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 1124, the processor 1121 may use an Advanced Graphics Port (AGP) to communicate with the display 1124. FIG. 11C depicts an embodiment of a computer or computer system 1100 in which the main processor 1121 may communicate directly with I/O device 1130b, for example via HYPERTRANSPORT, RAPIDIO, or INFINIBAND communications technology. FIG. 11C also depicts an embodiment in which local busses and direct communication are mixed: the processor 1121 communicates with I/O device 1130a using a local interconnect bus while communicating with I/O device 1130b directly.

A wide variety of I/O devices 1130a-1130n may be present in the computing device 1100. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices may be controlled by an I/O controller 1123 as shown in FIG. 11B. The I/O controller may control one or more I/O devices, such as a keyboard 1126 and a pointing device 1127, e.g., a mouse or optical pen. Furthermore, an I/O device may also provide storage and an installation medium 1116 for the computing device 1100. In still other embodiments, the computing device 1100 may provide USB connections (not shown) to receive handheld USB storage devices such as the USB Flash Drive line of devices manufactured by s Industry, Inc., of Los Alamitos, California.

Referring again to FIG. 11B, the computing device 1100 may support any suitable installation device 1116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 1100 may further include a storage device, such as one or more hard disk drives or redundant arrays of independent disks (storage devices), for storing an operating system and other related software, and for storing application software programs such as any program or software 1120 for implementing (e.g., software 1120 configured or designed for) the systems and methods described herein. In some embodiments, any of the installation devices 1116 could be used as the storage device. In some embodiments, the operating system and the software can be run from a bootable medium.

Furthermore, the computing device 1100 may include a network interface 1118 to interface to the network 1104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 1100 communicates with other computing devices 1100 via any type and form of gateway or tunneling protocol such as Secure Socket Layer (SSL) or Transport Layer Security (TLS). The network interface 1118 may include a built-in network adapter, network interface card, PCMCIA network card, card bus network adapter, wireless network adapter, USB network adapter, modem or any other device suitable for interfacing the computing device 1100 to any type of network capable of communication and performing the operations described herein.

In some embodiments, the computing device 1100 may include or be connected to one or more display devices 1124a-1124n. As such, any of the I/O devices 1130a-1130n and the I/O controller 1123 may include any type or form of suitable hardware, software, or combination of hardware and software to support, enable or provide for the connection and use of the display device(s) 1124a-1124n by the computing device 1100. For example, the computing device 1100 may include any type or form of video adapter, video card, driver, and library to interface, communicate, connect or otherwise use the display device(s) 1124a-1124n. In one embodiment, a video adapter may include multiple connectors to interface to the display device(s) 1124a-1124n. In other embodiments, the computing device 1100 may include multiple video adapters, with each video adapter connected to the display device(s) 1124a-1124n. In some embodiments, any portion of the operating system of the computing device 1100 may be configured for using multiple displays 1124a-1124n. One ordinarily skilled in the art will recognize and appreciate the various ways and embodiments that a computing device 1100 may be configured to have one or more display devices 1124a-1124n.

In further embodiments, an I/O device 1130 may be a bridge between the system bus 1150 and an external communication bus, such as a USB bus, an Apple Desktop Bus, an RS-232 serial connection, a SCSI bus, a FireWire bus, a FireWire 1100 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A computing device or system 1100 of the sort depicted in FIGS. 11B and 11C may operate under the control of an operating system, which controls scheduling of tasks and access to system resources. The computing device 1100 can be running any operating system, such as any of the versions of the MICROSOFT WINDOWS operating systems, the different releases of the Unix and Linux operating systems, any version of the MAC OS for Apple computers, any embedded operating system, any real-time operating system, any open source operating system, any proprietary operating system, any operating systems for mobile computing devices, or any other operating system capable of running on the computing device and performing the operations described herein. Typical operating systems include, but are not limited to, Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and form of a Unix operating system, among others.

The computer system 1100 can be any networking device, storage device, workstation, telephone, desktop computer, laptop or notebook computer, server, handheld computer, mobile telephone or other portable telecommunications device, media playing device, a gaming system, mobile computing device, or any other type or form of computing, telecommunications or media device that is capable of communication. The computer system 1100 has sufficient processor power and memory capacity to perform the operations described herein.

In some embodiments, the computing device 1100 may have different processors, operating systems, and input devices consistent with the device. For example, in one embodiment, the computing device 1100 is a smart phone, mobile device, tablet or personal digital assistant. In still other embodiments, the computing device 1100 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 1100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein. Aspects of the operating environments and components described above will become apparent in the context of the systems and methods disclosed herein.

It should be noted that certain passages of this disclosure can reference terms such as "first" and "second" in connection with devices signals, data, inputs, channels, and the like for purposes of identifying or differentiating one from another or from others. These terms are not intended to merely relate entities (e.g., a first input and a second input) temporally or according to a sequence, although in some cases, these entities can include such a relationship, nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a floppy disk, a hard disk, a CD-ROM, a flash memory card, a PROM, a RAM, a ROM, ASIC, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above-described embodiments, methods, and examples, but by all embodiments and methods within the scope and spirit of the disclosure.

What is claimed is:

1. A circuitry comprising:
a series of symmetrical stages with an initial stage in the series coupled to an input signal comprising a first plurality of phases and an output stage in the series coupling an output signal comprising a second plurality of phases to a calibration engine, wherein a quantity of the phases in the output signal comprising the second plurality of phases is increased based at least on a quantity of the symmetrical stages and a quantity of the first plurality of the phases in the input signal;
wherein the calibration engine calibrates a frequency of the circuitry within a range based at least on a target frequency;
wherein the calibration engine outputs a current provided to the series, the output current based at least on a calibrated frequency;
wherein each stage of the series of the symmetrical stages comprises a pair of first inverters coupled in series to a pair of cross-coupled inverters; and
wherein a capacitor coupled in parallel to the cross-coupled inverters, the capacitor to tune a frequency of each stage of the series of symmetrical stages.

2. The circuitry of claim 1,
wherein each stage of the series of the symmetrical stages comprises:
a pair of first inverters coupled in series to a pair of cross-coupled inverters or in parallel to a pair of feedforward resistors.

3. The circuitry of claim 2,
wherein each stage of the series of the symmetrical stages comprises the pair of first inverters coupled in series to the pair of cross-coupled inverters, and
wherein each stage of the series of symmetrical stages further comprises a switch coupled in parallel to the cross-coupled inverters, the switch to control a strength of injection of the output voltage.

4. The circuitry of claim 3, wherein the switch reduces a capacity loading of a previous stage of the series of the symmetrical stages on a subsequent stage of the series of symmetrical stages.

5. The circuitry of claim 2, wherein each stage of the series of symmetrical stages further comprises:
a capacitor coupled in parallel to the cross-coupled inverters, the capacitor to tune a frequency of each stage of the series of symmetrical stages.

6. The circuitry of claim 5, wherein the capacitor reduces a jitter of each stage of the series of the symmetrical stages.

7. The circuitry of claim 1, wherein the calibration engine further comprises:
a frequency calibrator; and
a current source coupled to the frequency calibrator,
wherein the frequency calibrator sends instructions to a circuitry of the current source, the instructions based at least on the calibrated frequency, and
wherein the current source transmits the current to the circuitry, the current based at least on the calibrated frequency.

8. The circuitry of claim 1, further comprising:
a series of loops, each loop comprising a series of inverters coupled in parallel to an amplifier, each loop to control a duty cycle of the phase of the first plurality of phases of the input signal.

9. The circuitry of claim 1, further comprising:
a series of buffers coupled between the series of the loops and the series of the symmetrical stages, the series of the buffers to provide a fixed swing of the output signal comprising the second plurality of phases.

10. The circuitry of claim 8, further comprising:
a series of buffers coupled between the series of loops and the series of the symmetrical stages, the series of the buffers to reduce at least one of a frequency range of the output signal or a sensitivity of a bandwidth of the frequency range of the output signal,
wherein the output signal comprises the second plurality of phases.

11. A system comprising:
a series of symmetrical stages, the series configured to receive an input signal comprising a first plurality of phases; and
a calibration engine coupled to an output stage of the series and configured to receive an output signal from the series,
a series of loops, each loop comprising a series of inverters coupled in parallel to an amplifier, each loop to control a duty cycle of the phase of the first plurality of phases of the input signal; and
wherein the output signal comprises a second plurality of phases and the calibration engine is configured to calibrate a frequency of the series of symmetrical stages to operate at a target frequency,
wherein the output stage of the series of symmetrical stages is configured to provide the output signal comprising an increase to a quantity of the first plurality of phases of the input signal based at least on a quantity of the symmetrical stages, and
wherein the calibration engine is configured to provide a current to the series of symmetrical stages based at least on the frequency calibrated by the calibration engine.

12. The system of claim 11, wherein each of the symmetrical stages comprises:
a pair of first inverters coupled in series to a pair of cross-coupled inverters or in parallel to a pair of feedforward resistors.

13. The system of claim 12,
wherein each stage of the series of the symmetrical stages comprises the pair of first inverters coupled in series to the pair of cross-coupled inverters, and
wherein each stage of the series of the symmetrical stages further comprises a switch coupled in parallel to the cross-coupled inverters, the switch to control a strength of injection of the output voltage.

14. The system of claim 13, wherein the switch reduces a capacity loading of a previous stage of the series of the symmetrical stages on a subsequent stage of the symmetrical stages.

15. The system of claim 12, wherein each stage of the series of symmetrical stages further comprises:
a capacitor coupled in parallel to the cross-coupled inverters, the capacitor to tune a frequency of each stage of the series of the symmetrical stages.

16. The system of claim 15, wherein the capacitor reduces a jitter of each stage of the series of symmetrical stages.

17. The system of claim 11, wherein the calibration engine further comprises:
a frequency calibrator; and
a current source coupled to the frequency calibrator,
wherein the frequency calibrator sends instructions to a circuitry of the current source, the instructions based at least on the calibrated frequency, and
wherein the current source transmits the current to the circuitry, the current based at least on the calibrated frequency.

18. A method comprising:
increasing a quantity of phases in an output signal comprising a first plurality of phases, the output signal based at least on a quantity of symmetrical stages in a series of the symmetrical stages and a quantity of a second plurality of phases in an input signal, wherein the series of the symmetrical stages with an initial stage in the series is coupled to the input signal comprising the second plurality of the phases and an output stage in the series coupling the output signal to a calibration engine;
calibrating, by the calibration engine, a frequency of a circuitry within a range based at least on a target frequency; and
outputting, by the calibration engine, a current coupled to the series, the output current based at least on a calibrated frequency;
sending, by a frequency calibrator of the calibration engine, instructions to a circuitry of a current source, the instructions based at least on the calibrated frequency, and
transmitting, by the current source to the frequency calibrator, the current to the circuitry, the current based at least on the calibrated frequency.

* * * * *